United States Patent
Yoon et al.

(10) Patent No.: US 11,832,493 B2
(45) Date of Patent: Nov. 28, 2023

(54) DISPLAY APPARATUS AND METHOD OF MANUFACTURING THE SAME

(71) Applicant: SAMSUNG DISPLAY CO., LTD., Yongin-si (KR)

(72) Inventors: Jangyeol Yoon, Yongin-si (KR); Jaemin Shin, Yongin-si (KR); Jongho Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 166 days.

(21) Appl. No.: 17/545,447

(22) Filed: Dec. 8, 2021

(65) Prior Publication Data

US 2022/0223659 A1    Jul. 14, 2022

(30) Foreign Application Priority Data

Jan. 8, 2021    (KR) .......... 10-2021-0002585

(51) Int. Cl.
| | |
|---|---|
| *H01L 21/00* | (2006.01) |
| *H10K 59/35* | (2023.01) |
| *H10K 50/80* | (2023.01) |
| *H10K 71/00* | (2023.01) |

(52) U.S. Cl.
CPC .......... *H10K 59/353* (2023.02); *H10K 50/80* (2023.02); *H10K 71/00* (2023.02)

(58) Field of Classification Search
CPC ....... H10K 59/353; H10K 50/80; H10K 71/00
See application file for complete search history.

(56) References Cited

U.S. PATENT DOCUMENTS

| | | | |
|---|---|---|---|
| 10,839,744 B2 | 11/2020 | Li et al. | |
| 2014/0118271 A1* | 5/2014 | Lee | ........................ G06F 3/0488 345/173 |
| 2016/0381789 A1 | 12/2016 | Rogers et al. | |
| 2017/0294610 A1* | 10/2017 | Sasaki | .................. H10K 59/131 |
| 2019/0347989 A1* | 11/2019 | Lee | ........................ H10K 59/124 |

(Continued)

FOREIGN PATENT DOCUMENTS

| | | |
|---|---|---|
| JP | 2010282903 A | 12/2010 |
| KR | 1020190074874 A | 6/2019 |

(Continued)

OTHER PUBLICATIONS

Heung Cho Ko et al., Curvilinear Electronics Formed Using Silicon Membrane Circuits and Elastomeric Transfer Elements, 2009, 5, No. 23, pp. 2703-2709, Inter Science.

*Primary Examiner* — Douglas M Menz
(74) *Attorney, Agent, or Firm* — CANTOR COLBURN LLP

(57) ABSTRACT

A display apparatus disposed on an object including a first surface having a first shape and a second surface having a second shape different from the first shape, the display apparatus includes a display panel arranged on the object, including a first display area extending along the first surface, a second display area extending along the second surface, a plurality of first pixels arranged with a preset interval in the first display area and a plurality of second pixels arranged with the preset interval in the second display area, where when tensile force is applied, a first elongation rate of the display panel in the first display area is different from a second elongation rate of the display panel in the second display area.

20 Claims, 25 Drawing Sheets

(56) References Cited

U.S. PATENT DOCUMENTS

2020/0168824 A1* 5/2020 Park .................... H10K 77/111
2022/0139888 A1* 5/2022 Kim .................... H01L 25/0753
257/89

FOREIGN PATENT DOCUMENTS

| KR | 102080525 B1 | 2/2020 |
| KR | 1020200029042 A | 3/2020 |
| KR | 1020200074634 A | 6/2020 |

* cited by examiner

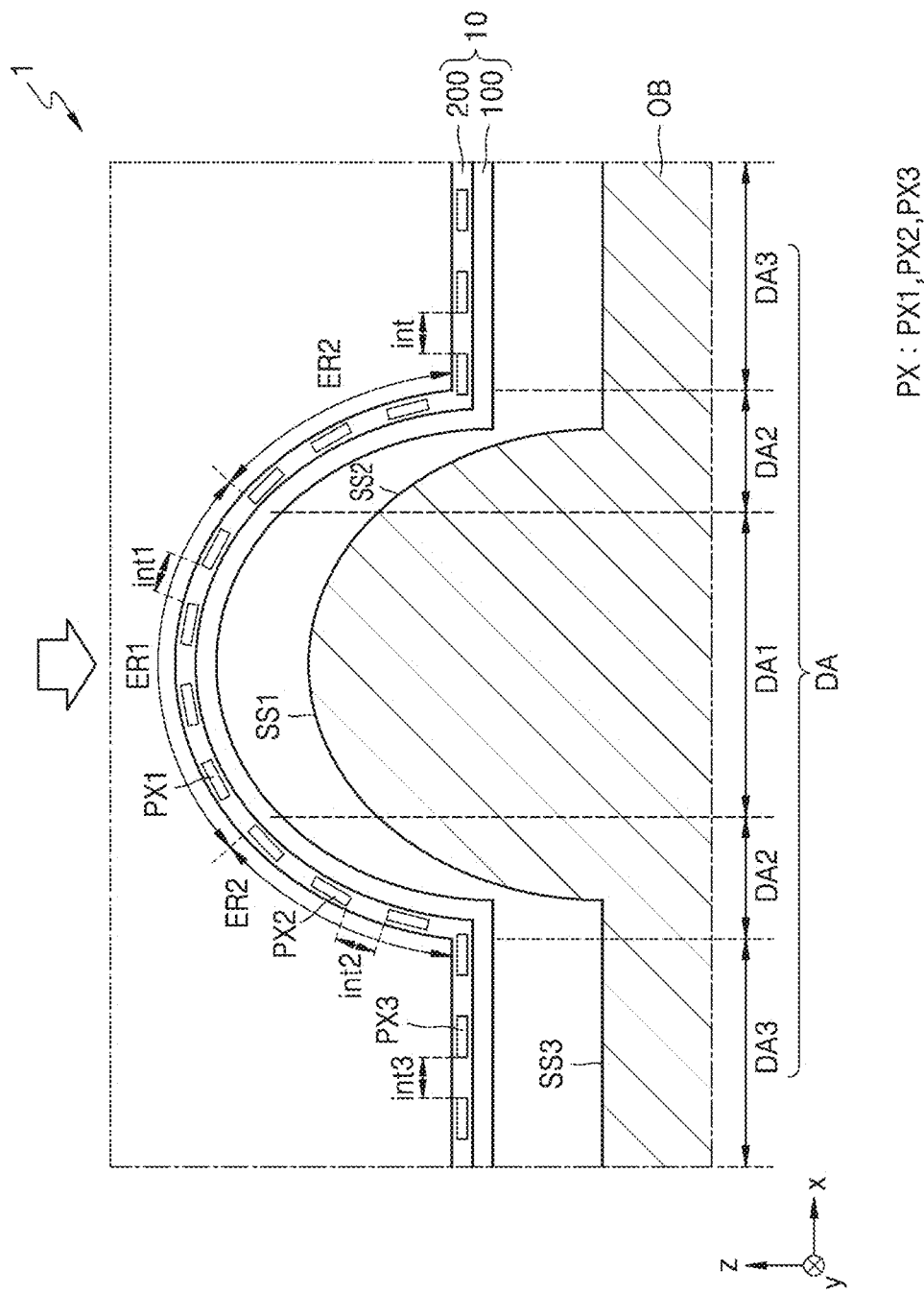

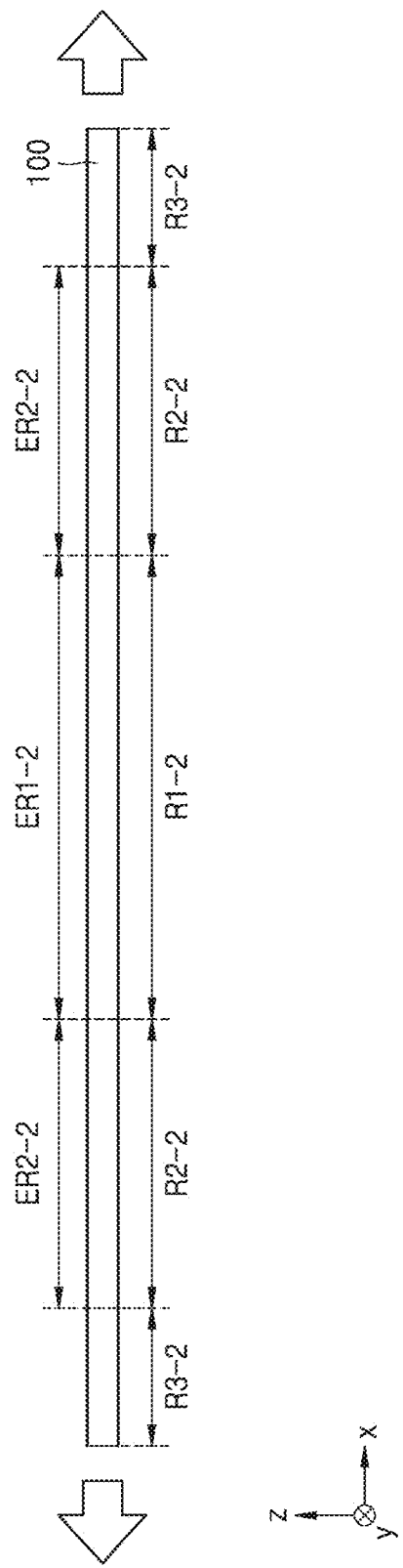

DISPLAY APPARATUS AND METHOD OF MANUFACTURING THE SAME

This application claims priority to Korean Patent Application No. 10-2021-0002585, filed on Jan. 8, 2021, and all the benefits accruing therefrom under 35 U.S.C. § 119, the content of which in its entirety is herein incorporated by reference.

BACKGROUND

1. Field

Embodiments relate to a display apparatus that displays an image and a method of manufacturing the display apparatus.

2. Description of the Related Art

As display apparatuses that visually express an electric signal develop, various display apparatuses are being introduced with excellent characteristics, such as being thinner and more lightweight, and low power consumption. Flexible display apparatuses that are foldable or rollable in a roll shape have been introduced, for example.

Recently, research is being actively carried out on a stretchable display apparatus that may be changed in various shapes.

SUMMARY

Since a stretchable display apparatus is changeable in various shapes, the stretchable display apparatus may be arranged on a locally irregular surface shape of an object. A display apparatus may include a plurality of pixels that display an image. When the display apparatus is arranged along a locally irregular surface shape of an object, intervals between the plurality of pixels may be different from each other.

Embodiments include a display apparatus and a method of manufacturing the same, which may entirely or substantially prevent a plurality of pixels from being viewed to users as being non-uniformly arranged in the display apparatus arranged along a locally irregular surface shape of an object.

Additional features will be set forth in part in the description which follows and, in part, will be apparent from the description, or may be learned by practice of the presented embodiments of the invention.

In an embodiment of the invention, a display apparatus disposed on an object including a first surface having a first shape and a second surface having a second shape different from the first shape, includes a display panel arranged on the object and including a first display area extending along the first surface, a second display area extending along the second surface, a plurality of first pixels arranged with a preset interval in the first display area and a plurality of second pixels arranged with the preset interval in the second display area, where when tensile force is applied, a first elongation rate of the display panel in the first display area is different from a second elongation rate of the display panel in the second display area.

In an embodiment, the first display area may include a plurality of first pixel areas and a plurality of first through areas, the plurality of first pixels may be respectively arranged in the plurality of first pixel areas, and the plurality of first through areas in which respective openings are defined through the display panel may be arranged outside the plurality of first pixel areas and passing through the display panel, and the second display area may include a plurality of second pixel areas and a plurality of second through areas, the plurality of second pixels may be respectively arranged in the plurality of second pixel areas, and the plurality of second through areas in which respective openings are defined through the display panel may be arranged outside the plurality of second pixel areas and passing through the display panel.

In an embodiment, a first region of one of the plurality of first pixel areas may be different from a second region of one of the plurality of second pixel area.

In an embodiment, the first display area may further include a plurality of first connection areas extending between the plurality of first pixel areas adjacent to each other, the second display area may further include a plurality of second connection areas extending between the plurality of second pixel areas adjacent to each other, and a shape of one of the plurality of first connection areas may be different from a shape of one of the plurality of second connection areas.

In an embodiment, a first width of one of the plurality of first connection areas may be different from a second width of one of the plurality of second connection areas.

In an embodiment, a first length of one of the plurality of first connection areas may be different from a second length of one of the plurality of second connection areas.

In an embodiment, one of the plurality of first connection areas may extend in a linear shape, and one of the plurality of second connection areas may extend in a curved shape.

In an embodiment, the display panel may further include an inorganic layer arranged in the first display area and the second display area, and a ratio of the inorganic layer to the display panel in the first display area may be different from a ratio of the inorganic layer to the display panel in the second display area.

In an embodiment, the display apparatus may further include a film layer arranged on at least one of a first surface of the display panel and a second surface of the display panel opposite to the first surface of the display panel in a thickness direction, where, when the tensile force is applied, an elongation rate of the film layer in the first display area may be different from an elongation rate of the film layer in the second display area.

In an embodiment, the display panel in the first display area may be in one of a relatively high elongation state and a relatively low elongation state, and the display panel in the second display area may be in a remaining one of the relatively high elongation state and the relatively low elongation state.

In an embodiment of the invention, a method of manufacturing a display apparatus includes elongating a display substrate including a first region and a second region such that the display substrate extends along a surface shape of an object, determining a first elongation state of the display substrate in the first region and a second elongation state of the display substrate in the second region, and forming a display panel including a first display area and a second display area and extending in one direction, a plurality of first pixels being arranged with a first interval set from the first elongation state in the first display area, and a plurality of second pixels being arranged with a second interval set from the second elongation state in the second display area.

In an embodiment, the method may further include transforming the display panel to extend along a surface shape of the object, and changing the first interval and the second interval to be identical to each other.

In an embodiment, the first elongation state may be one of a relatively high elongation state and a relatively low elongation state, and the second elongation state may be a remaining one of the relatively high elongation state and the relatively low elongation state.

In an embodiment, the display panel may include a first surface of the display panel and a second surface of the display panel opposite to the first surface of the display panel in a thickness direction, and the transforming of the display panel may include allowing a mold to face one of the first surface of the display panel and the second surface of the display panel.

In an embodiment, when tensile force is applied, the display panel may have a first elongation rate in the first display area and have a second elongation rate in the second display area.

In an embodiment, the method may further include attaching a film layer to at least one of a first surface of the display panel and a second surface of the display panel opposite to the first surface of the display panel in a thickness direction, where, when tensile force is applied, an elongation rate of the film layer in the first display area may be different from an elongation rate of the film layer in the second display area.

In an embodiment, the method may further include after the attaching of the film layer to the display panel, processing the film layer arranged on at least one of the first display area and the second display area.

In an embodiment, the elongating of the display substrate along the surface shape of the object may include transforming the display substrate extending in one direction to extend along a surface shape of a mold.

In an embodiment of the invention, a method of manufacturing a display apparatus includes preparing a substrate including a first region and a second region each extending along a surface shape of an object, applying tensile force to extend the first region and the second region in one direction, determining a first elongation state of the substrate in the first region and a second elongation state of the substrate in the second region, and forming a plurality of first pixels with a first interval set from the first elongation state in the first region and forming a plurality of second pixels with a second interval set from the second elongation state in the second region.

The method may further include after the forming of the plurality of first pixels and the plurality of second pixels, removing the tensile force.

BRIEF DESCRIPTION OF THE DRAWINGS

The above and other features, and advantages of predetermined embodiments of the invention will be more apparent from the following description taken in conjunction with the accompanying drawings, in which:

FIGS. 9A to 9E are cross-sectional views showing an embodiment of a method of manufacturing a display apparatus;

FIGS. 14A to 14D are cross-sectional views showing another embodiment of a method of manufacturing a display apparatus.

DETAILED DESCRIPTION

Figure 1:
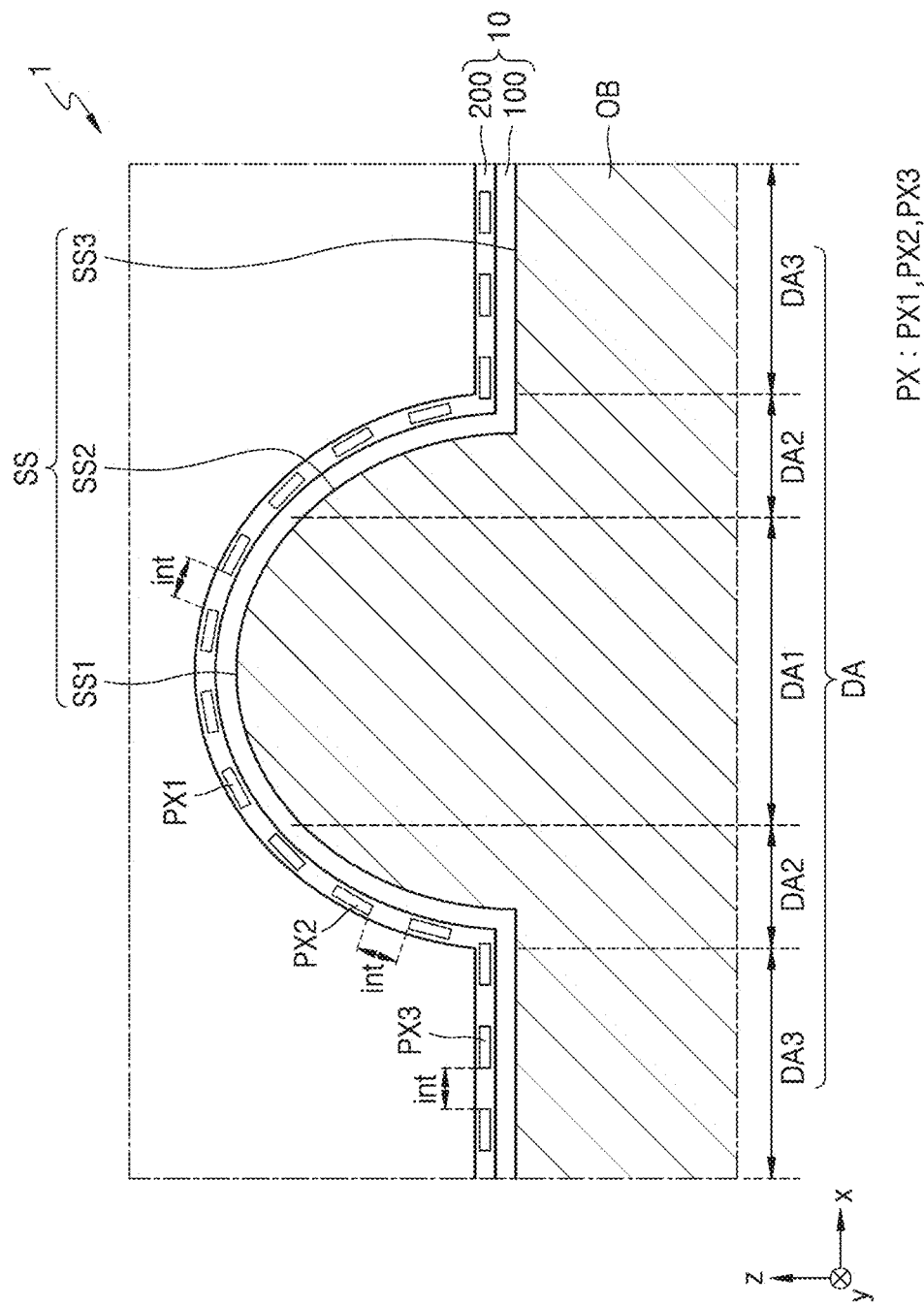
FIG. 1 is a cross-sectional view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIG. 1 is a cross-sectional view of an embodiment of a display apparatus 1.

Referring to FIG. 1, the display apparatus 1 may include an apparatus for displaying moving images or still images and may be used as a display screen of various products including televisions, notebook computers, monitors, advertisement boards, Internet of things ("IOT") apparatus as well as portable electronic apparatuses including mobile phones, smart phones, tablet personal computers ("PC"), mobile communication terminals, electronic organizers, electronic books, portable multimedia players ("PMP"), navigations, and ultra mobile personal computers ("UMPC"). In addition, the display apparatus 1 may be used in wearable devices including smartwatches, watchphones, glasses-type displays, and head-mounted displays ("HMD"). In addition, the display apparatus 1 may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles.

The display apparatus 1 may be arranged on an object OB. The object OB may include various objects to which the display apparatus 1 is attached. In an embodiment, the object OB may include a structure supporting the display apparatus 1.

The object OB may include a surface SS having a predetermined shape. In other words, the surface SS of the object OB may have a shape set in advance. In an embodiment, the surface SS of the object OB may have a plurality of curvatures. In another embodiment, the surface SS of the object OB may be bent. In another embodiment, the surface SS of the object OB may not be entirely flat. The surface SS of the object OB may be irregular.

The surface SS of the object OB may include a plurality of surfaces. The plurality of surfaces may each be partial surfaces defining a portion of the surface SS of the object OB. In an embodiment, the surface SS of the object OB may include a first surface SS1, a second surface SS2, and a third surface SS3. The first surface SS1 may have a first shape. The second surface SS2 may have a second shape. The third surface SS3 may have a third shape. In an embodiment, one of the first shape, the second shape, and the third shape may be different from another of the first shape, the second shape, and the third shape. In the specification, when the first shape is different from the second shape, it means that the first shape does not coincide with the second shape. In an embodiment, the first surface SS1 may have a first curvature. The second surface SS2 may have a second curvature. The first curvature of the first surface SS1 may be less or greater than the second curvature of the second surface SS2. The third surface SS3 may be flat. Hereinafter, the case where the surface SS of the object OB includes the first surface SS1, the second surface SS2, and the third surface SS3 is mainly described in detail. However, the invention is not limited thereto. The embodiment is applicable to the surface SS of the object OB having various shapes.

The display apparatus 1 may include a display panel 10. The display panel 10 may display an image. The display panel 10 may be an organic light-emitting display panel that uses an organic light-emitting diode including an organic emission layer. In an alternative embodiment, the display panel 10 may be a light-emitting diode display panel that uses a light-emitting diode. The size of the light-emitting diode may be a micro scale or a nano scale. In an embodiment, a light-emitting diode may be a micro light-emitting diode. In an alternative embodiment, a light-emitting diode may be a nanorod light-emitting diode. A nanorod light-emitting diode may include gallium nitride (GaN). In an embodiment, a color-conversion layer may be arranged on a nanorod light-emitting diode. The color-conversion layer may include quantum dots. In an alternative embodiment, the display panel 10 may be a quantum-dot light-emitting display panel that uses a quantum-dot light-emitting diode including a quantum-dot emission layer. In an alternative embodiment, the display panel 10 may be an inorganic light-emitting display panel that uses an inorganic light-emitting element including an inorganic semiconductor. Hereinafter, the case where the display panel 10 is an organic light-emitting display panel that uses an organic light-emitting diode as a display element is mainly described in detail.

In an embodiment, the display panel 10 may include a display area DA. The display area DA may be an area which displays an image. The display area DA may extend along the surface SS of the object OB. In an embodiment, the display area DA may extend along the first surface SS1, the second surface SS2, and the third surface SS3. In an embodiment, the display area DA may include a first display area DA1, a second display area DA2, and a third display area DA3. The first display area DA1 may extend along the first surface SS1. In this case, the first display area DA1 may have a first curvature. The second display area DA2 may extend along the second surface SS2. In this case, the second display area DA2 may have a second curvature. The third display area DA3 may extend along the third surface SS3. In this case, the third display area DA3 may be flat. Accordingly, the display panel 10 may extend along a surface shape of the object OB.

The display panel 10 may include a substrate 100 and a pixel layer 200. The substrate 100 may overlap the first display area DA1, the second display area DA2, and the third display area DA3. The substrate 100 may extend along the surface SS of the object OB.

In an embodiment, the substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, or cellulose acetate propionate. The substrate 100 including a polymer resin may be flexible, rollable, or bendable. The substrate 100 may have a multi-layered structure including a base layer and a barrier layer each including a polymer resin.

The pixel layer 200 may be arranged on the substrate 100. The pixel layer 200 may include a pixel PX. The pixel layer 200 may include a plurality of pixels PX. The plurality of pixels PX may be arranged in the display area DA and may emit light. The plurality of pixels PX may each include sub-pixels. In an embodiment, a pixel PX may include a red sub-pixel, a green sub-pixel, and a blue sub-pixel. A pixel PX may include a red sub-pixel, a green sub-pixel, a blue sub-pixel, and a white sub-pixel.

The plurality of pixels PX may be arranged with a constant interval int. In an embodiment, the plurality of pixels PX may be arranged in the first display area DA1, the second display area DA2, and the third display area DA3 with a constant interval int. The constant interval int may be a distance between the plurality of pixels PX adjacent to each other in an extension direction of the display panel 10. In an embodiment, a distance between first pixels PX1 adjacent to each other in the first display area DA1, a distance between second pixels PX2 adjacent to each other in the second display area DA2, and a distance between third pixels PX3 adjacent to each other in the third display area DA3 may be the same. Accordingly, in an embodiment, a plurality of pixels PX arranged on the surface SS of the object OB may be entirely or substantially prevented from being viewed to a user as being non-uniformly arranged.

When viewed by a user, the plurality of pixels PX may be uniformly arranged in the display area DA. In an embodiment, a user may view the display apparatus 1 in a z-direction (also referred to as a thickness direction) of FIG. 1. When viewed by a user, distances between a plurality of adjacent pixels PX may be substantially the same. In an embodiment, by a user, a distance between a plurality of adjacent first pixels PX1 in the first display area DA1, a distance between a plurality of adjacent second pixels PX2 in the second display area DA2, and a distance between a plurality of adjacent third pixels PX3 in the third display area DA3 may be substantially the same. Therefore, in an embodiment, the plurality of pixels PX arranged on the surface SS of the object may be entirely or substantially prevented from being viewed to a user as being non-uniformly arranged.

The density of the plurality of pixels PX in the display area DA may be substantially the same. Accordingly, the plurality of pixels PX may be uniformly arranged in the display area DA. In an embodiment, the density of the first pixels PX1 in the first display area DA1, the density of the second pixels PX2 in the second display area DA2, and the density of the third pixels PX3 in the third display area DA3 may be substantially the same. The density of the first pixels PX1 in the first display area DA1 may be defined by the number of first pixels PX1 per area of the first display area DA1. The density of the second pixels PX2 in the second display area DA2 may be defined by the number of second pixels PX2 per area of the second display area DA2. The density of the third pixels PX3 in the third display area DA3 may be defined by the number of third pixels PX3 per area of the third display area DA3. Therefore, in an embodiment, the plurality of pixels PX arranged on the surface SS of the object may be entirely or substantially prevented from being viewed to a user as being non-uniformly arranged.

In an embodiment, the pixel layer 200 may include a pixel circuit and a display element. The pixel circuit may be electrically connected to the display element. The pixel circuit may control light emission of the display element. The display element may emit light. In an embodiment, the display element may be an organic light-emitting diode. In an embodiment, the pixel circuit and the display element may be a portion of a pixel PX.

In an embodiment, the pixel layer 200 may include an insulating layer. The insulating layer may include an inorganic material and/or an organic material.

The display panel 10 in the first display area DA1 may be in one of a relatively high elongation state and a relatively low elongation state, and the display panel 10 in the second display area DA2 may be in the other of the relatively high elongation state and the relatively low elongation state. The elongation state may be defined as a state in which the display panel 10 is stretched due to tensile force. The relatively high elongation state may be a state further elongated than the relatively low elongation state. In an embodiment, when the tensile force is removed, the display panel 10 may be transformed. In this case, transformation of the relatively high elongation state may be greater than that of relatively low elongation state.

In an embodiment, the display panel 10 in the first display area DA1 is in the relatively high elongation state, the display panel 10 in the second display area DA2 is in the relatively low elongation state, and the display panel 10 in the third display area DA3 is in a state that is not elongated. In this case, the display panel 10 in the first display area DA1 may be further elongated than the display panel 10 in the second display area DA2. The display panel 10 in the second display area DA2 may be further elongated than the display panel 10 in the third display area DA3.

In an embodiment, the display panel 10 in the first display area DA1 is in the relatively low elongation state, the display panel 10 in the second display area DA2 is in the relatively high elongation state, and the display panel 10 in the third display area DA3 is in a state that is not elongated. In this case, the display panel 10 in the second display area DA2 may be further elongated than the display panel 10 in the first display area DA1. The display panel 10 in the first display area DA1 may be further elongated than the display panel 10 in the third display area DA3.

In the case where the display apparatus extending in one direction and including a plurality of adjacent pixels PX arranged with a uniform interval is elongated and/or contracted, an interval between adjacent first pixels PX1, an interval between adjacent second pixels PX2, and an interval between adjacent third pixels PX3 may be different from one another. Accordingly, the pixels PX may be arranged non-uniformly. In this case, when a user views the display apparatus 1 arranged on the surface SS of the object OB, the user may sense a decrease in resolution in a predetermined display area DA due to non-uniform interval between the pixels PX.

In contrast, in an embodiment, even though the display panel 10 is elongated and/or contracted along the surface SS of the object OB, an interval int between the pixels PX arranged in the display area DA may be maintained constant. Accordingly, in an embodiment, a decrease in resolution in a predetermined display area DA may be prevented or reduced.

In another embodiment, the display panel 10 may not be in an elongation state. In this case, the substrate 100 extends along the surface SS of the object OB, and then tensile force may be applied to the substrate 100. When tensile force is applied to the substrate 100, the substrate 100 may extend in one direction. Under this state, the pixel layer 200 may be provided. Next, the display panel 10 may be contracted to extend along the surface SS of the object OB by removing the tensile force.

When the tensile force is applied, a first elongation rate of the display panel 10 in the first display area DA1 may be different from a second elongation rate of the display panel 10 in the second display area DA2. In the specification, an elongation rate may be defined as a degree by which an element is stretched. That is, when constant tensile force is applied, a degree by which the display panel 10 in the first display area DA1 stretches may be different from a degree by which the display panel 10 in the second display area DA2 stretches.

An elongation rate of the display panel 10 may be determined by the material of the display panel 10 and/or the structure of the display panel 10. In an embodiment, the structure of the display panel 10 in the first display area DA1 may be different from the structure of the display panel 10 in the second display area DA2. In an alternative embodiment, the material of the display panel 10 in the first display area DA1 may be different from the material of the display panel 10 in the second display area DA2. In an alternative embodiment, the structure of the display panel 10 in the first display area DA1 may be different from the structure of the display panel 10 in the second display area DA2, and the material of the display panel 10 in the first display area DA1 may be different from the material of the display panel 10 in the second display area DA2.

In an embodiment, a first elongation rate of the display panel 10 in the first display area DA1 may be greater than a second elongation rate of the display panel 10 in the second display area DA2. In another embodiment, a first elongation rate of the display panel 10 in the first display area DA1 may be less than a second elongation rate of the display panel 10 in the second display area DA2. Accordingly, in the case where tensile force or compressing force is applied to extend or contract the display panel 10 along the surface SS of the object OB, degrees by which the display panel 10 in the display area DA1 and the second display area DA2 is elongated and/or contracted may be different from each other.

In an embodiment, when tensile force is applied, an elongation rate of the display panel 10 may vary depending on the surface SS of the object OB. Accordingly, even though the display panel 10 extends along the surface SS of the object OB, an interval int between a plurality of adjacent pixels PX may be maintained constant.

Figure 2:
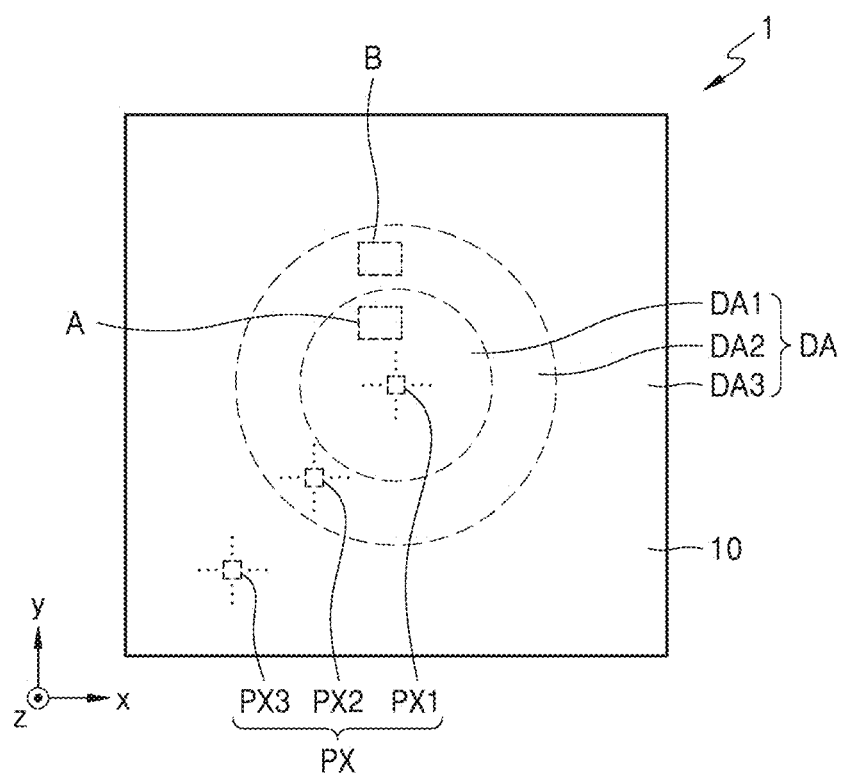
FIG. 2 is a plan view of an embodiment of a display apparatus.

FIG. 2 is a plan view of an embodiment of the display apparatus 1. FIG. 2 is a plan view of the first display area DA1 and the second display area DA2 before the first display area DA1 and the second display area DA2 are transformed to extend along the surface of the object. In this case, the display apparatus 1 may be flat.

Referring to FIG. 2, the display panel 10 may include the first display area DA1 and the second display area DA2. When tensile force is applied, the first elongation rate of the first display area DA1 may be different from the second elongation rate of the second display area DA2.

The second display area DA2 may surround at least a portion of the first display area DA1, and the third display area DA3 may surround at least a portion of the second display area DA2. In another embodiment, the first display area DA1, the second display area DA2, and the third display area DA3 may be adjacent to each other. In another embodiment, the first display area DA1, the second display area DA2, and the third display area DA3 may be spaced apart from each other. As described above, the positions of the first display area DA1, the second display area DA2, and the third display area DA3 may be various inside the display panel 10.

Density of the plurality of pixels PX in the display area DA may be different depending on a position thereof in the display area DA. In an embodiment, a density of the first pixels PX1 in the first display area DA1, a density of the second pixels PX2 in the second display area DA2, and a density of the third pixels PX3 in the third display area DA3 may be different from one another. The density of the first pixels PX1 in the first display area DA1 may be defined as the number of first pixels PX1 per area of the first display area DA1. The density of the second pixels PX2 in the second display area DA2 may be defined as the number of second pixels PX2 per area of the second display area DA2. The density of the third pixels PX3 in the third display area DA3 may be defined as the number of third pixels PX3 per area of the third display area DA3.

Accordingly, when the display apparatus 1 that is flat is transformed along the surface shape of the object, the densities of the plurality of pixels PX may be the same within the display area DA, and the plurality of pixels PX may be entirely or substantially prevented from being viewed as being non-uniformly arranged on the surface of the object.

Figure 3A:
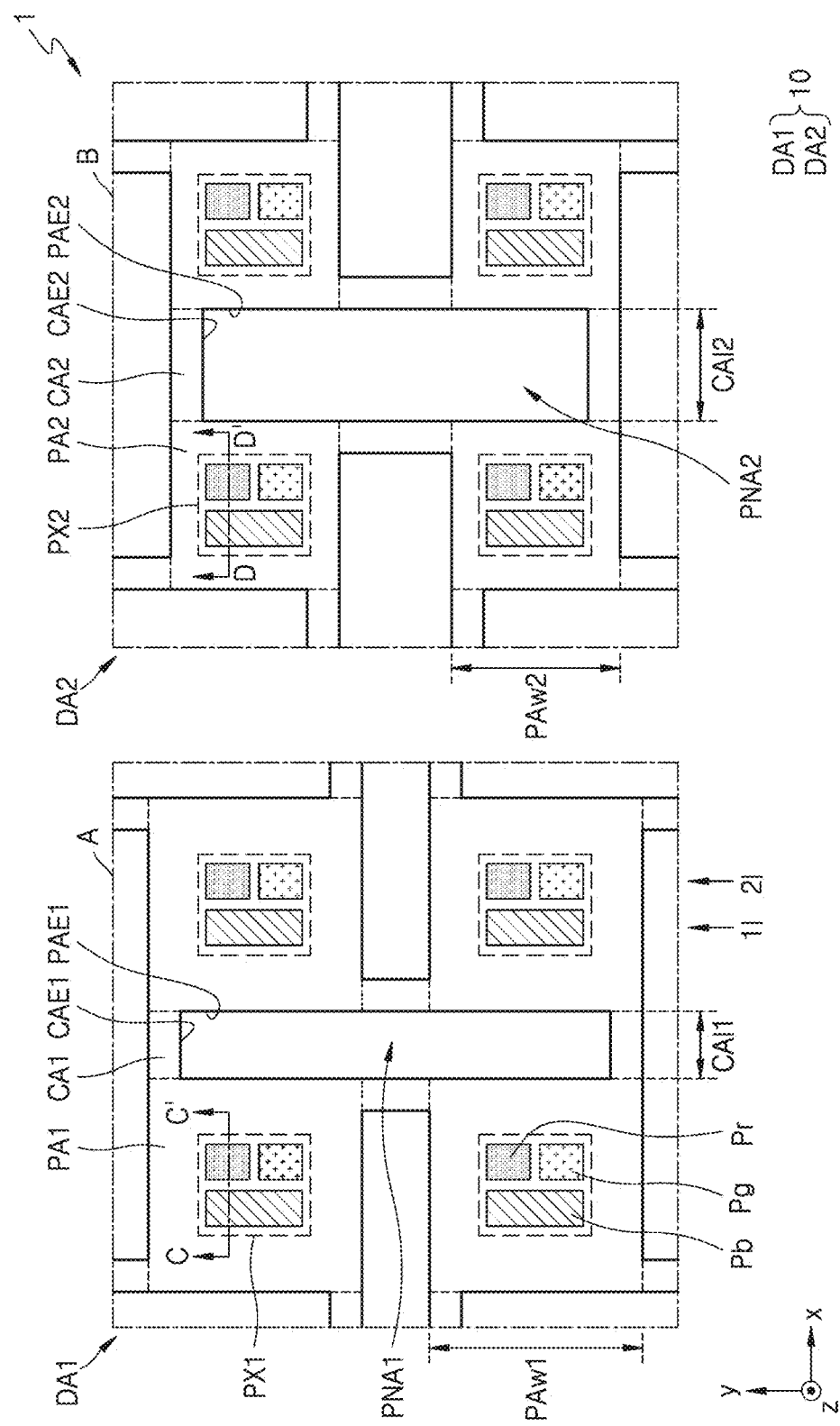
FIGS. 3A to 3C are plan views of a first display area and a second display area according to various embodiments.
Figure 3B:
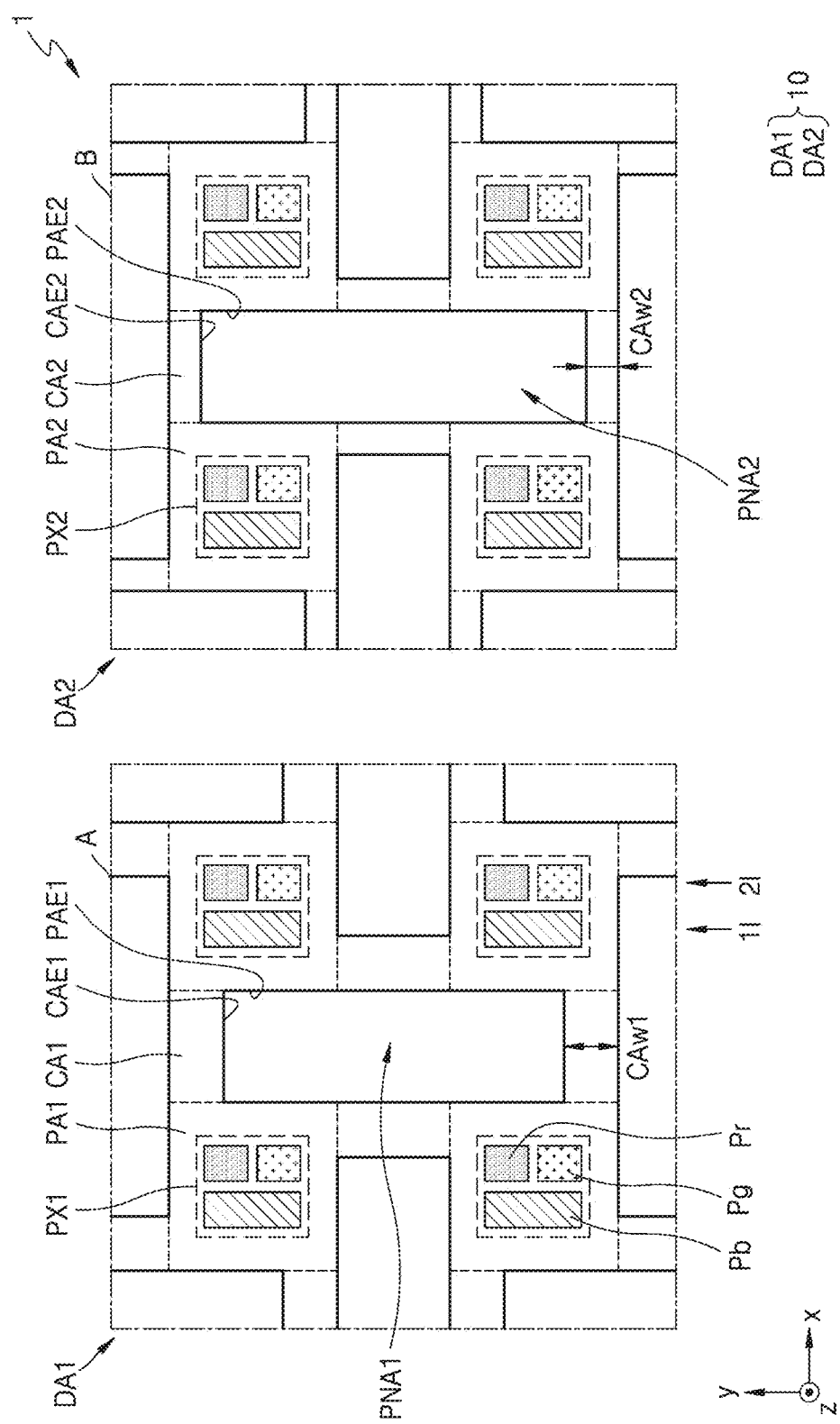
Figure 3C:
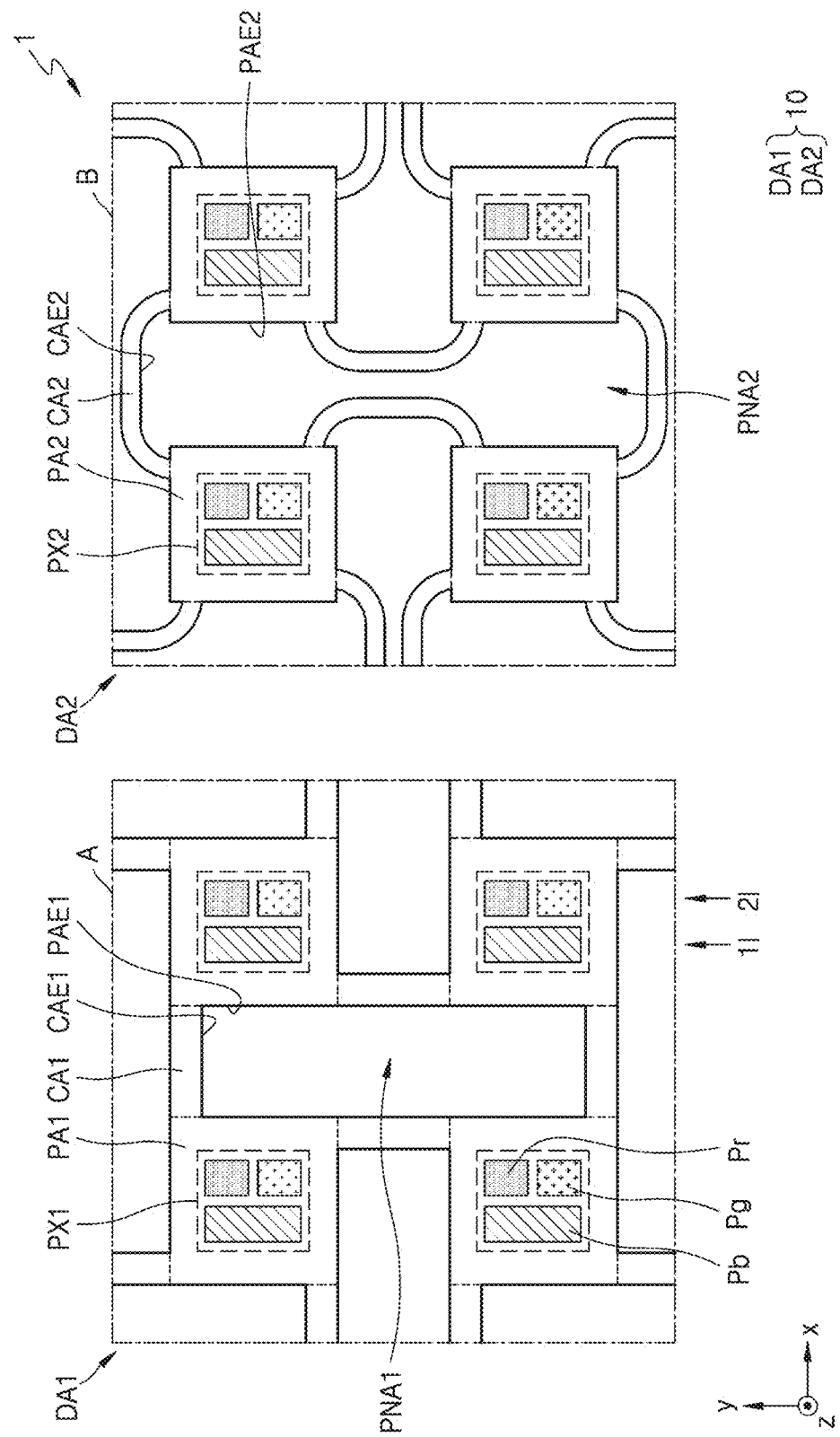

FIGS. 3A to 3C are plan views of the first display area DA1 and the second display area DA2 according to various embodiments. FIGS. 3A to 3C are enlarged views of regions A and B of FIG. 2. In FIGS. 3A to 3C, because the same reference numerals as those of FIGS. 1 and 2 denote the same elements, descriptions thereof are omitted.

Referring to FIGS. 3A to 3C, the display panel 10 may include the first display area DA1 and the second display area DA2. When tensile force is applied, the first elongation rate of the first display area DA1 may be different form the second elongation rate of the second display area DA2. In an embodiment, a structure of the display panel 10 in the first display area DA1 may be different from a structure of the display panel 10 in the second display area DA2.

The first display area DA1 may include a first pixel area PA1, a first connection area CA1, and a first through area PNA1. In an embodiment, the first pixel area PA1 may have a quadrangular shape. In another embodiment, the first pixel area PA1 may have various shapes such as a polygonal shape, a circular shape, or an elliptical shape.

The first pixel area PA1 may be provided in plural. The plurality of first pixel areas PA1 may be spaced apart from each other. In an embodiment, the plurality of first pixel areas PA1 may be spaced apart from each other in a first direction (e.g., an x-direction or a (−) x-direction) and/or a second direction (e.g., a y-direction or a (−) y-direction).

The first pixel PX1 may be arranged in the first pixel area PA1. In an embodiment, the plurality of first pixels PX1 may be respectively arranged in the plurality of first pixel areas PA1. In another embodiment, the plurality of first pixels PX1 may be arranged in one first pixel area PA1. Hereinafter, the case where the plurality of first pixels PX1 is respectively arranged in the plurality of first pixel areas PA1 is mainly described in detail.

The first connection area CA1 may extend from the first pixel area PA1. In an embodiment, the first connection area CA1 may extend in the first direction (e.g., the x-direction or the (−) x-direction) and/or the second direction (e.g., the y-direction or the (−) y-direction) from the first pixel area PA1. In another embodiment, the first connection area CA1 may extend in a direction crossing the first direction (e.g., the x-direction or the (−) x-direction) and the second direction (e.g., the y-direction or the (−) y-direction) from the first pixel area PA1.

In an embodiment, an edge PAE1 of the first pixel area PA1 may be perpendicular to an edge CAE1 of the first connection area CA1. In another embodiment, the edge PAE1 of the first pixel area PA1 may extend to the edge CAE1 of the first connection area CA1 in a curved line.

In an embodiment, the first connection area CA1 may extend between adjacent first pixel areas PA1. In an embodiment, the first pixel areas PA1 may each extend to four first connection areas CA1. Four first connection areas CA1 extend from one first pixel area PA1 may extend in different directions, and each first connection area CA1 may extend to another first pixel area PA1 adjacent to the one first pixel area PA1. In an embodiment, the first pixel area PA1 and the first connection area CA1 may be provided as one body.

An opening may be defined through the display panel 10 in the first through area PNA1. The first pixel PX1 may not be arranged in the first through area PNA1. The first through area PNA1 may be an empty area of the display panel 10. Because the first display area DA1 includes a plurality of first through areas PNA1, which are empty areas, the first display area DA1 may be elongated and/or contracted.

In an embodiment, the first display area DA1 may include a plurality of first through areas PNA1. The plurality of first through areas PNA1 may be arranged outside the plurality of first pixel areas PA1. The plurality of first through areas PNA1 may be spaced apart from each other with the first pixel area PA1 and/or the first connection area CA1 therebetween.

At least a portion of the shape of the first through area PNA1 may be defined by edges PAE1 of the first pixel area PA1 and edges CAE1 of the first connection area CA1. In an embodiment, the shape of the first through area PNA1 may be defined by the edges PAE1 of the first pixel area PA1 and the edges CAE1 of the first connection area CA1. In this case, it is shown in FIGS. 3A to 3C that the edges PAE1 of the first pixel area PA1 and the edges CAE1 of the first connection area CA1 constitute a closed curve. In another embodiment, one side of the first through area PNA1 may be open.

The second display area DA2 may include a second pixel area PA2, a second connection area CA2, and a second through area PNA2. In an embodiment, the second pixel area PA2 may have a quadrangular shape. In another embodiment, the second pixel area PA2 may have various shapes such as a polygonal shape, a circular shape, or an elliptical shape.

The second pixel area PA2 may be provided in plural. The plurality of second pixel areas PA2 may be spaced apart from each other. In an embodiment, the plurality of second pixel areas PA2 may be spaced apart from each other in the first direction (e.g., the x-direction or the (−) x-direction) and/or the second direction (e.g., the y-direction or the (−) y-direction).

The second pixel PX2 may be arranged in the second pixel area PA2. In an embodiment, the plurality of second pixels PX2 may be respectively arranged in the plurality of second pixel areas PA2. In another embodiment, the plurality of second pixels PX2 may be arranged in one second pixel area PA2. Hereinafter, the case where the plurality of second pixels PX2 may be respectively arranged in the plurality of second pixel areas PA2 is mainly described in detail.

The second connection area CA2 may extend from the second pixel area PA2. In an embodiment, the second connection area CA2 may extend in the first direction (e.g., the x-direction or the (−) x-direction) and/or the second direction (e.g., the y-direction or the (−) y-direction) from the second pixel area PA2. In another embodiment, the second connection area CA2 may extend in a direction crossing the first direction (e.g., the x-direction or the (−) x-direction) and the second direction (e.g., the y-direction or the (−) y-direction) from the second pixel area PA2.

In an embodiment, an edge PAE2 of the second pixel area PA2 may be perpendicular to an edge CAE2 of the second connection area CA2. In another embodiment, the edge PAE2 of the second pixel area PA2 may extend to the edge CAE2 of the second connection area CA2 in a curved line.

In an embodiment, the second connection area CA2 may extend between adjacent second pixel areas PA2. In an embodiment, the second pixel areas PA2 may each be connected to four second connection areas CA2. Four second connection areas CA2 connected to one second pixel area PA2 may extend in different directions, and each second connection area CA2 may extend to another second pixel area PA2 adjacent to the one second pixel area PA2. In an embodiment, the second pixel area PA2 and the second connection area CA2 may be provided as one body.

An opening may be defined through the display panel 10 in the second through area PNA2. The second pixel PX2 may not be arranged in the second through area PNA2. The second through area PNA2 may be an empty area of the display panel 10. Because the second display area DA2 includes a plurality of second through areas PNA2, which are empty areas, the second display area DA2 may be elongated and/or contracted.

In an embodiment, the second display area DA2 may include a plurality of second through areas PNA2. The plurality of second through areas PNA2 may be arranged outside the plurality of second pixel areas PA2. The plurality of second through areas PNA2 may be spaced apart from each other with the second pixel area PA2 and/or the second connection area CA2 therebetween.

At least a portion of the shape of the second through area PNA2 may be defined by edges PAE2 of the second pixel area PA2 and edges CAE2 of the second connection area CA2. In an embodiment, the shape of the second through area PNA2 may be defined by the edges PAE2 of the second pixel area PA2 and the edges CAE2 of the second connection area CA2. In this case, it is shown in FIGS. 3A to 3C that the edges PAE2 of the second pixel area PA2 and the edges CAE2 of the second connection area CA2 constitute a closed curve. In another embodiment, one side of the second through area PNA2 may be open.

The shape of one of a plurality of first through areas PNA1 may be different from that of one of a plurality of second through areas PNA2. In an embodiment, the width of the first through area PNA1 in the first direction (e.g., the x-direction or the (−) x-direction) may be different from that of the second through area PNA2 in the first direction (e.g., the x-direction or the (−) x-direction). In another embodiment, the width of the first through area PNA1 in the second direction (e.g., the y-direction or the (−) y-direction) may be different from that of the second through area PNA2 in the second direction (e.g., the y-direction or the (−) y-direction). In another embodiment, one of the first through area PNA1 and the second through area PNA2 may have a curved shape, and the other of the first through area PNA1 and the second through area PNA2 may have a linear shape.

Accordingly, the first elongation rate of the display panel 10 in the first display area DA1 may be different from the second elongation rate of the display panel 10 in the second display area DA2.

Referring to FIG. 3A, a first area of one of a plurality of first pixel area PA1 may be different from a second area of one of a plurality of second pixel area PA2. In this case, for uniform resolution, the area of the first pixel PX1 may be the same as the area of the second pixel PX2.

In an embodiment, the first region of the first pixel area PA1 may be greater than the second region of the second pixel area PA2. In this case, when tensile force is applied, the first elongation rate of the display panel 10 in the first display area DA1 may be less than the second elongation rate of the display panel 10 in the second display area DA2. In another embodiment, the first region of the first pixel area PA1 may be less than the second region of the second pixel area PA2. In this case, when tensile force is applied, the first elongation rate of the display panel 10 in the first display area DA1 may be greater than the second elongation rate of the display panel 10 in the second display area DA2.

A width PAw1 of the first pixel area PA1 may be different from a width PAw2 of the second pixel area PA2. The width PAw1 of the first pixel area PA1 may be a distance between the edges PAE1 of the first pixel area PA1 facing each other. In an embodiment, the width PAw1 of the first pixel area PA1 may be a distance between the edges PAE1 of the first pixel area PA1 facing each other in the second direction (e.g., the y-direction or the (−) y-direction). The width PAw2 of the second pixel area PA2 may be a distance between the edges PAE2 of the second pixel area PA2 facing each other. In an embodiment, the width PAw2 of the second pixel area PA2 may be a distance between the edges PAE2 of the second pixel area PA2 facing each other in the second direction (e.g., the y-direction or the (−) y-direction).

In an embodiment, the width PAw1 of the first pixel area PA1 may be greater than the width PAw2 of the second pixel area PA2. In this case, when tensile force is applied, the first elongation rate of the display panel 10 in the first display area DA1 may be less than the second elongation rate of the display panel 10 in the second display area DA2. In another embodiment, the width PAw1 of the first pixel area PA1 may be less than the width PAw2 of the second pixel area PA2. In this case, when tensile force is applied, the first elongation rate of the display panel 10 in the first display area DA1 may be greater than the second elongation rate of the display panel 10 in the second display area DA2.

In an embodiment, the shape of one of the plurality of first connection areas CA1 may be different from that of one of the plurality of second connection areas CA2. The shape of the first connection area CA1 may be defined by the edge CAE1 of the first connection area CA1. The shape of the second connection area CA2 may be defined by the edge CAE2 of the second connection area CA2. In other words, the shape of the first connection area CA1 may not coincide with that of the second connection area CA2.

A first length CAl1 of one of the plurality of first connection areas CA1 may be different from a second length CAl2 of one of the plurality of second connection areas CA2. The first length CAl1 of the first connection area CA1 may be a distance between the edges PAE1 of the first pixel area PA1 facing each other with the first through area PNA1 therebetween. In an embodiment, the first length CAl1 of the first connection area CA1 may be a distance between the edges PAE1 of the first pixel area PA1 facing each other in the first direction (e.g., the x-direction or the (−) x-direction) with the first through area PNA1 therebetween. The second length CAl2 of the second connection area CA2 may be a distance between the edges PAE2 of the second pixel area PA2 facing each other with the second through area PNA2 therebetween. In an embodiment, the second length CAl2 of the second connection area CA2 may be a distance between the edges PAE2 of the second pixel area PA2 facing each other in the first direction (e.g., the x-direction or the (−) x-direction) with the second through area PNA2 therebetween.

In an embodiment, the first length CAl1 of the first connection area CA1 may be less than the second length CAl2 of the second connection area CA2. In this case, when tensile force is applied, the first elongation rate of the display panel 10 in the first display area DA1 may be less than the second elongation rate of the display panel 10 in the second display area DA2. In another embodiment, the first length CAl1 of the first connection area CA1 may be greater than the second length CAl2 of the second connection area CA2. In this case, when tensile force is applied, the first elongation rate of the display panel 10 in the first display area DA1 may be greater than the second elongation rate of the display panel 10 in the second display area DA2.

Referring to FIG. 3B, a first width CAw1 of one of the plurality of first connection areas CA1 may be different from a second width CAw2 of one of the plurality of second connection areas CA2. The first width CAw1 of the first connection area CA1 may be a distance between the edges CAE1 of the first connection area CA1 facing each other in a direction perpendicular to an extension direction of the first connection area CA1. In an embodiment, in the case where the first connection area CA1 extends in the first direction (e.g., the x-direction or the (−) x-direction), the first width CAw1 of the first connection area CA1 may be a distance between the edges CAE1 of the first connection area CA1 facing each other in the second direction (e.g., the y-direction or the (−) y-direction). A second width CAw2 of the second connection area CA2 may be a distance between the edges CAE2 of the second connection area CA2 facing each other in a direction perpendicular to an extension direction of the second connection area CA2. In an embodiment, in the case where the second connection area CA2 extends in the first direction (e.g., the x-direction or the (−) x-direction), the second width CAw2 of the second connection area CA2 may be a distance between the edges CAE2 of the second connection area CA2 facing each other in the second direction (e.g., the y-direction or the (−) y-direction).

In an embodiment, the first width CAw1 of the first connection area CA1 may be greater than the second width CAw2 of the second connection area CA2. In this case, when tensile force is applied, the first elongation rate of the display panel 10 in the first display area DA1 may be less than the second elongation rate of the display panel 10 in the second display area DA2. In another embodiment, the first width CAw1 of the first connection area CA1 may be less than the second width CAw2 of the second connection area CA2. In this case, when tensile force is applied, the first elongation rate of the display panel 10 in the first display area DA1 may be greater than the second elongation rate of the display panel 10 in the second display area DA2.

Referring to FIG. 3C, one of the plurality of first connection areas CA1 may extend in a linear shape, and one of the plurality of second connection areas CA2 may extend in a curved shape. The first connection area CA1 may extend in a linear shape and the edge CAE1 of the first connection area CA1 may extend in one direction. In an embodiment, the second connection area CA2 may extend in a curved shape and the edge CAE2 of the second connection area CA2 may include a curved shape. In this case, when tensile force is applied, the first elongation rate of the display panel 10 in the first display area DA1 may be less than the second elongation rate of the display panel 10 in the second display area DA2.

In another embodiment, one of the plurality of first connection areas CA1 may extend in a curved shape, and one of the plurality of second connection areas CA2 may extend in a linear shape. In this case, when tensile force is applied, the first elongation rate of the display panel 10 in the first display area DA1 may be greater than the second elongation rate of the display panel 10 in the second display area DA2.

In another embodiment, one of the plurality of first connection areas CA1 and one of the plurality of second connection areas CA2 may each extend in a curved shape.

Though not shown, in an embodiment, the thickness of one of the plurality of first connection areas CA1 may be different from that of one of the plurality of second connection areas CA2. In an embodiment, the thickness of one of the plurality of first pixel areas PA1 may be different from that of one of the plurality of second pixel areas PA2. Accordingly, when tensile force is applied, the first elongation rate of the display panel 10 in the first display area DA1 may be different from the second elongation rate of the display panel 10 in the second display area DA2.

Referring back to FIGS. 3A to 3C, the first pixel PX1 and the second pixel PX2 may each include a red sub-pixel Pr, a green sub-pixel Pg, and a blue sub-pixel Pb. A red sub-pixel Pr, a green sub-pixel Pg, and a blue sub-pixel Pb may respectively emit red light, green light, and blue light. In another embodiment, the first pixel PX1 and the second pixel PX2 may each include a red sub-pixel Pr, a green sub-pixel Pg, a blue sub-pixel Pb, and a white sub-pixel. A red sub-pixel Pr, a green sub-pixel Pg, a blue sub-pixel Pb, and a white sub-pixel may respectively emit red light, green light, blue light, and white light. Hereinafter, the case where the first pixel PX1 and the second pixel PX2 may each include a red sub-pixel Pr, a green sub-pixel Pg, and a blue sub-pixel Pb is mainly described in detail.

In an embodiment, the area of a sub-pixel of the first pixel PX1 may be the same as the area of a sub-pixel of the second pixel PX2. Accordingly, the first display area DA1 and the second display area DA2 may maintain the same resolution.

In an embodiment, a sub-pixel arrangement structure of the first pixel PX1 and a sub-pixel arrangement structure of the second pixel PX2 may be provided in an S-stripe structure. In an embodiment, a blue sub-pixel Pb may be arranged on a first column 11, and a red sub-pixel Pr and a green sub-pixel Pg may be arranged on an adjacent second column 21. In this case, blue sub-pixels Pb may be arranged in a quadrangular shape having long sides in the second direction (e.g., the y-direction or the (−) y-direction), and red sub-pixels Pr and green sub-pixels Pg may be arranged in a quadrangular shape. In other words, a side of a red sub-pixel Pr and a side of a green sub-pixel Pg may face long sides of blue sub-pixels Pb.

In another embodiment, a sub-pixel arrangement structure of the first pixel PX1 and a sub-pixel arrangement structure of the second pixel PX2 may be provided in an S-stripe structure. In an embodiment, a red sub-pixel Pr, a green sub-pixel Pg, and a blue sub-pixel Pb may be arranged side by side in the first direction (e.g., the x-direction or the (−) x-direction) or in the second direction (e.g., the y-direction or the (−) y-direction). In another embodiment, a sub-pixel arrangement structure of the first pixel PX1 and a sub-pixel arrangement structure of the second pixel PX2 may be provided in a pentile structure.

Figure 4:
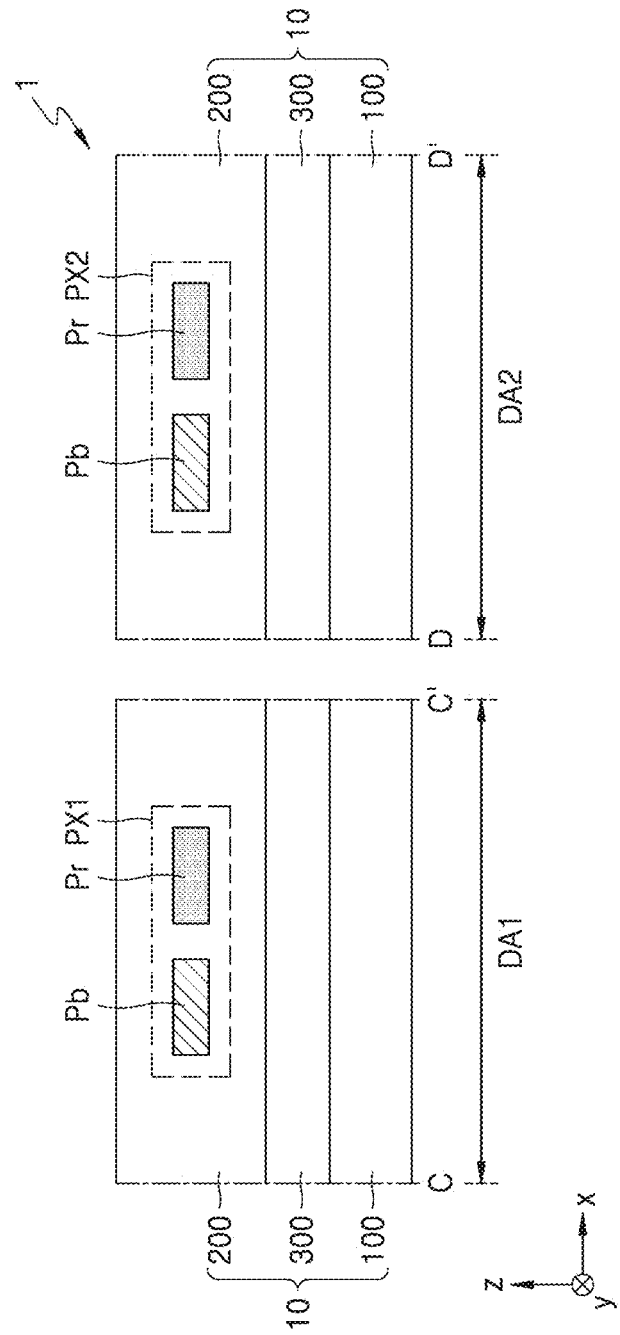
FIG. 4 is a cross-sectional view of a display apparatus taken along lines C-C' and D-D' of FIG. 3A.

FIG. 4 is a cross-sectional view of the display apparatus 1 taken along lines C-C' and D-D' of FIG. 3A. In FIG. 4, because the same reference numerals as those of FIG. 3A denote the same elements, repeated descriptions thereof are omitted.

Referring to FIG. 4, the display apparatus 1 may include the display panel 10. The display panel 10 may include the first display area DA1 and the second display area DA2. When tensile force is applied, the first elongation rate of the first display area DA1 may be different form the second elongation rate of the second display area DA2. In an embodiment, a structure of the display panel 10 in the first display area DA1 may be different from a structure of the display panel 10 in the second display area DA2.

The display panel 10 may include the substrate 100, the pixel layer 200, and an inorganic layer 300. The pixel layer 200 may include the first pixel PX1 in the first display area DA1. The pixel layer 200 may include the second pixel PX2 in the second display area DA2. In an embodiment, the first pixel PX1 and the second pixel PX2 may each include a blue sub-pixel Pb, a red sub-pixel Pr, and a green sub-pixel (not shown).

In an embodiment, when tensile force is applied, the elongation rate of the substrate 100 in the first display area DA1 may be different from the elongation rate of the substrate 100 in the second display area DA2. In an embodiment, the elongation rate of the substrate 100 in the first display area DA1 may be greater than the elongation rate of the substrate 100 in the second display area DA2. In another embodiment, the elongation rate of the substrate 100 in the first display area DA1 may be less than the elongation rate of the substrate 100 in the second display area DA2.

In the case where the substrate 100 includes an organic material, the softness of the organic material in the first display area DA1 may be different from the softness of the organic material in the second display area DA2. In the case where the substrate 100 includes polyimide, the hardness of the polyimide in the first display area DA1 may be different from the hardness of the polyimide in the second display area DA2. In an alternative embodiment, the material of the substrate 100 in the first display area DA1 may be different from the material of the substrate 100 in the second display area DA2.

The inorganic layer 300 may be arranged between the substrate 100 and the pixel layer 200. In an embodiment, the inorganic layer 300 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be ZnO and/or $ZnO_2$.

In an embodiment, a ratio of the inorganic layer 300 to the display panel 10 in the first display area DA1 may be the same as a ratio of the inorganic layer 300 to the display panel 10 in the second display area DA2. In another embodiment, a ratio of the inorganic layer 300 to the display panel 10 in the first display area DA1 may be different from a ratio of the inorganic layer 300 to the display panel 10 in the second display area DA2. The ratio of the inorganic layer 300 to the display panel 10 may be a ratio of the volume of the organic layer 300 to the volume of the display panel 10. In an alternative embodiment, the ratio of the inorganic layer 300 to the display panel 10 may be a ratio of the weight of the inorganic layer 300 to the weight of the display panel 10. In an alternative embodiment, the ratio of the inorganic layer 300 to the display panel 10 may be a ratio of the thickness of the inorganic layer 300 to the thickness of the display panel 10. In an alternative embodiment, the ratio of the inorganic layer 300 to the display panel 10 may be a ratio of the area of the inorganic layer 300 to the area of the display panel 10.

Figure 5:
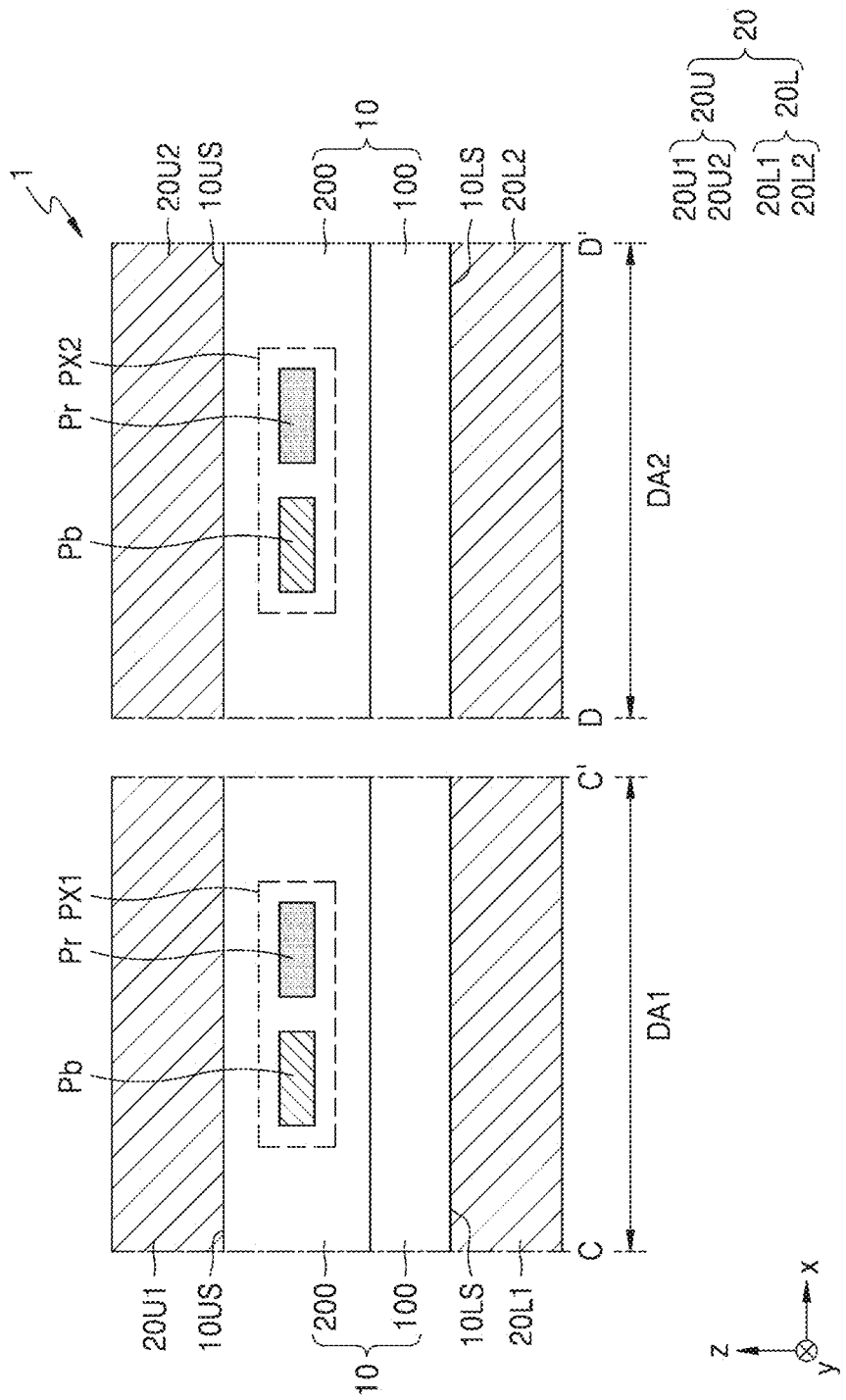
FIG. 5 is a cross-sectional view of a display apparatus taken along lines C-C' and D-D' of FIG. 3A.

FIG. 5 is a cross-sectional view of the display apparatus 1 taken along lines C-C' and D-D' of FIG. 3A. In FIG. 5, because the same reference numerals as those of FIG. 4 denote the same elements, repeated descriptions thereof are omitted.

Referring to FIG. 5, the display apparatus 1 may include the display panel 10 and a film layer 20. The display panel 10 may include the first display area DA1 and the second display area DA2. When tensile force is applied, the first elongation rate of the display panel 10 in the first display area DA1 may be different from the second elongation rate of the display panel 10 in the second display area DA2. In an embodiment, the structure of the display panel 10 in the first display area DA1 may be different from the structure of the display panel 10 in the second display area DA2.

The display panel 10 may include the substrate 100 and the pixel layer 200. The pixel layer 200 may include the first pixel PX1 in the first display area DA1. The pixel layer 200 may include the second pixel PX2 in the second display area DA2. In an embodiment, the first pixel PX1 and the second pixel PX2 may each include a blue sub-pixel, a red sub-pixel, and a green sub-pixel (not shown).

The film layer 20 may be arranged on at least one of an upper surface 10US of the display panel 10 and a lower surface 10LS of the display panel 10. The upper surface 10US of the display panel 10 may be opposite to the lower surface 10LS of the display panel 10. The film layer 20 may include an organic material. The film layer 20 may include polymer. In an embodiment, the film layer 20 may include polyethylene terephthalate.

In an embodiment, the film layer 20 may include an upper film layer 20U and a lower film layer 20L such that the upper film layer 20U is disposed on the upper surface 10US of the display panel 10, and the lower film layer 20L is disposed on the lower surface 10LS of the display panel 10. In another embodiment, the film layer 20 may include the upper film layer 20U and may not be arranged on the lower surface 10LS of the display panel 10. In another embodiment, the film layer 20 may not be arranged on the upper surface 10US of the display panel 10 and may include the lower film layer 20L. Hereinafter, the case where the film layer 20 includes the upper film layer 20U and the lower film layer 20L is mainly described in detail.

In an embodiment, when tensile force is applied, the elongation rate of the film layer 20 that overlaps the first display area DA1 may be different from the elongation rate of the film layer 20 that overlaps the second display area DA2. In an embodiment, the elongation rate of the film layer 20 that overlaps the first display area DA1 may be greater than the elongation rate of the film layer 20 that overlaps the second display area DA2. In another embodiment, the elongation rate of the film layer 20 that overlaps the first display area DA1 may be less than the elongation rate of the film layer 20 that overlaps the second display area DA2. In another embodiment, when tensile force is applied, the elongation rate of the film layer 20 that overlaps the first display area DA1 may be the same as the elongation rate of the film layer 20 that overlaps the second display area DA2.

In an embodiment, the shape of the film layer 20 that overlaps the first display area DA1 may be different from the shape of the film layer 20 that overlaps the second display area DA2. In an embodiment, a groove or a hole may be defined in at least one of the film layer 20 that overlaps the first display area DA1 and the film layer 20 that overlaps the second display area DA2. In another embodiment, the shape of the film layer 20 that overlaps the first display area DA1 may be the same as the shape of the film layer 20 that overlaps the second display area DA2.

In an embodiment, the film layer 20 that overlaps the first display area DA1 may include a first upper film layer 20U1 and a first lower film layer 20L1. In this case, a groove or a hole may be defined in at least one of the first upper film layer 20U1 and the first lower film layer 20L1. In an embodiment, the film layer 20 that overlaps the second display area DA2 may include a second upper film layer 20U2 and a second lower film layer 20L2. In this case, a groove or a hole may be defined in at least of the second upper film layer 20U2 and the second lower film layer 20L2.

In an embodiment, the material of the film layer 20 that overlaps the first display area DA1 may be different from the material of the film layer 20 that overlaps the second display area DA2. In an embodiment, only one of the film layer 20 that overlaps the first display area DA1 and the film layer 20 that overlaps the second display area DA2 may further include an additive. In an embodiment, the modulus of the film layer 20 that overlaps the first display area DA1 may be different from the modulus of the film layer 20 that overlaps the second display area DA2.

Figure 6:
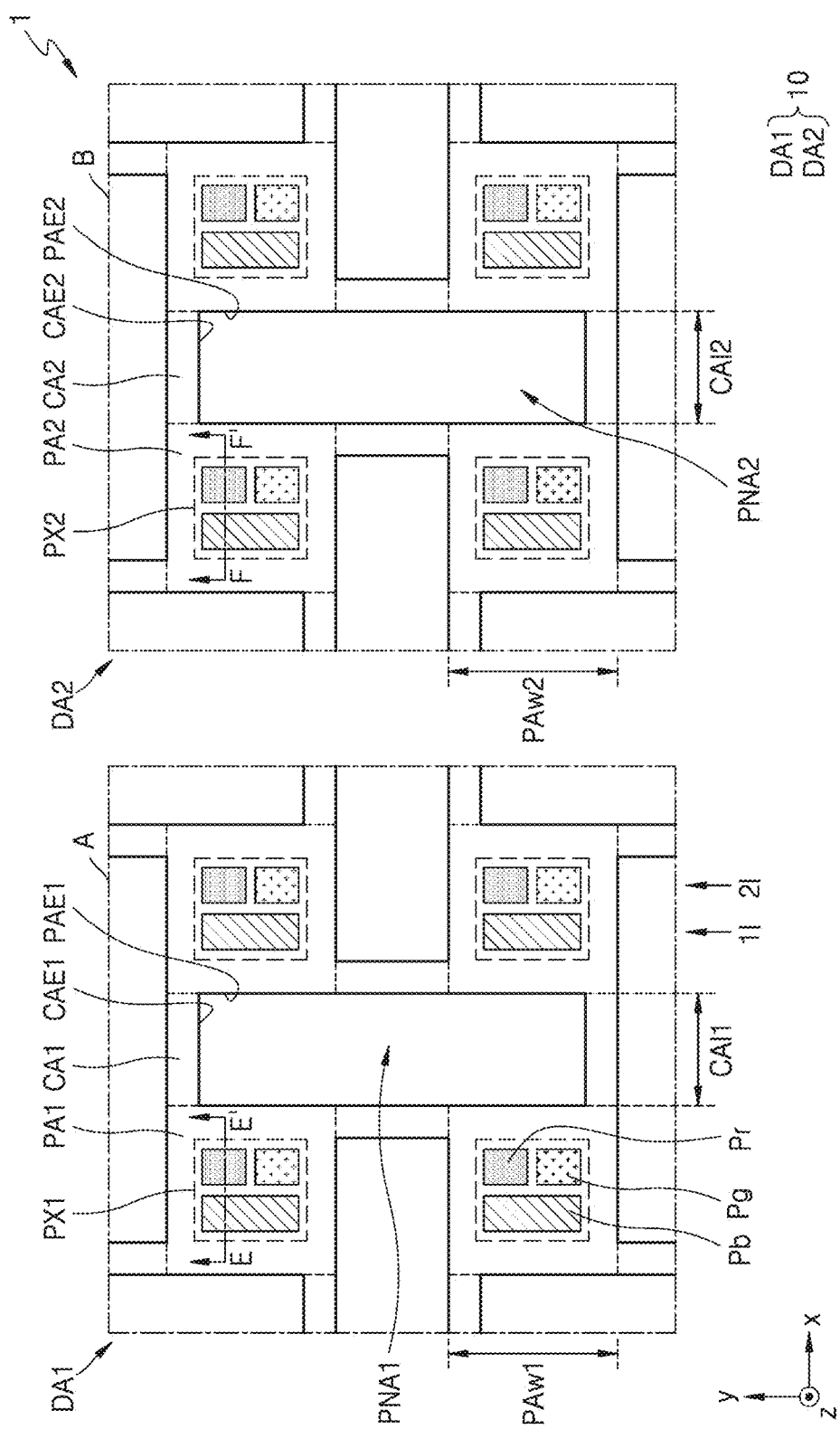
FIG. 6 is a plan view of an embodiment of a first display area and a second display area.

FIG. 6 is a plan view of an embodiment of the first display area DA1 and the second display area DA2. FIG. 6 is an enlarged view of regions A and B of FIG. 2. In FIG. 6, because the same reference numerals as those of FIGS. 3A to 3C denote the same elements, repeated descriptions thereof are omitted.

Referring to FIG. 6, the display panel 10 may include the first display area DA1 and the second display area DA2. In an embodiment, the structure of the display panel 10 in the first display area DA1 may be the same as the structure of the display panel 10 in the second display area DA2.

The first display area DA1 may include the first pixel area PA1, the first connection area CA1, and the first through area PNA1. The first pixel PX1 may be arranged in the first pixel area PA1. The first connection area CA1 may extend from the first pixel area PA1. An opening may be defined through the display panel 10 in the first through area PNA1.

The second display area DA2 may include the second pixel area PA2, the second connection area CA2, and the second through area PNA2. The second pixel PX2 may be arranged in the second pixel area PA2. The second connection area CA2 may extend from the second pixel area PA2. An opening may be defined through the display panel 10 in the second through area PNA2.

In an embodiment, the shape of one of the plurality of first through areas PNA1 may be the same as the shape of one of the plurality of second through areas PNA2. In an embodiment, the width PAw1 of the first pixel area PA1 may be the same as the width PAw2 of the second pixel area PA2. In an embodiment, the first length CAl1 of the first connection area CA1 may be the same as the second length CAl2 of the second connection area CA2.

A kind of the material of the display panel 10 in the first display area DA1 may be different from a kind of the material of the display panel 10 in the second display area DA2. Accordingly, when tensile force is applied, the first elongation rate of the display panel 10 in the first display area DA1 may be different from the second elongation rate of the display panel 10 in the second display area DA2.

In an embodiment, a ratio of an inorganic layer (not shown) to the display panel 10 in the first display area DA1 may be different from a ratio of an inorganic layer (not shown) to the display panel 10 in the second display area DA2. In an embodiment, a ratio of the area of the inorganic layer to the entire area of the display panel 10 in the first display area DA1 may be different from a ratio of the area of the inorganic layer to the entire area of the display panel 10 in the second display area DA2.

Figure 7A:
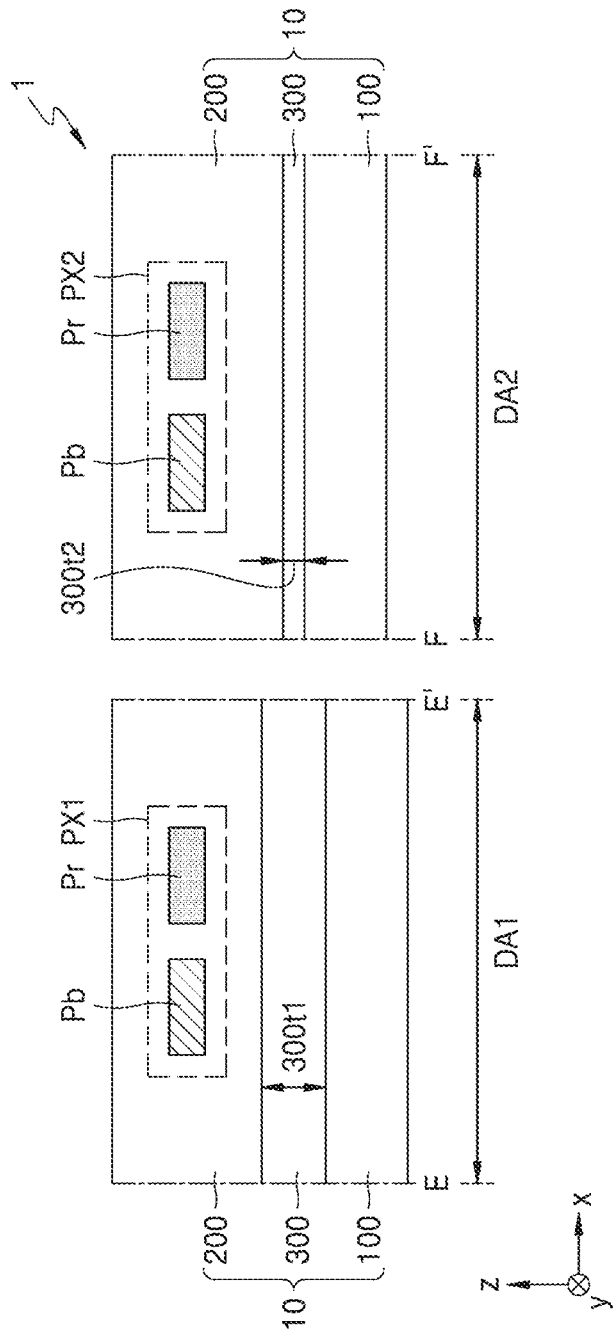
FIGS. 7A and 7B are cross-sectional views of a display apparatus taken along lines E-E' and F-F' of FIG. 6.
Figure 7B:
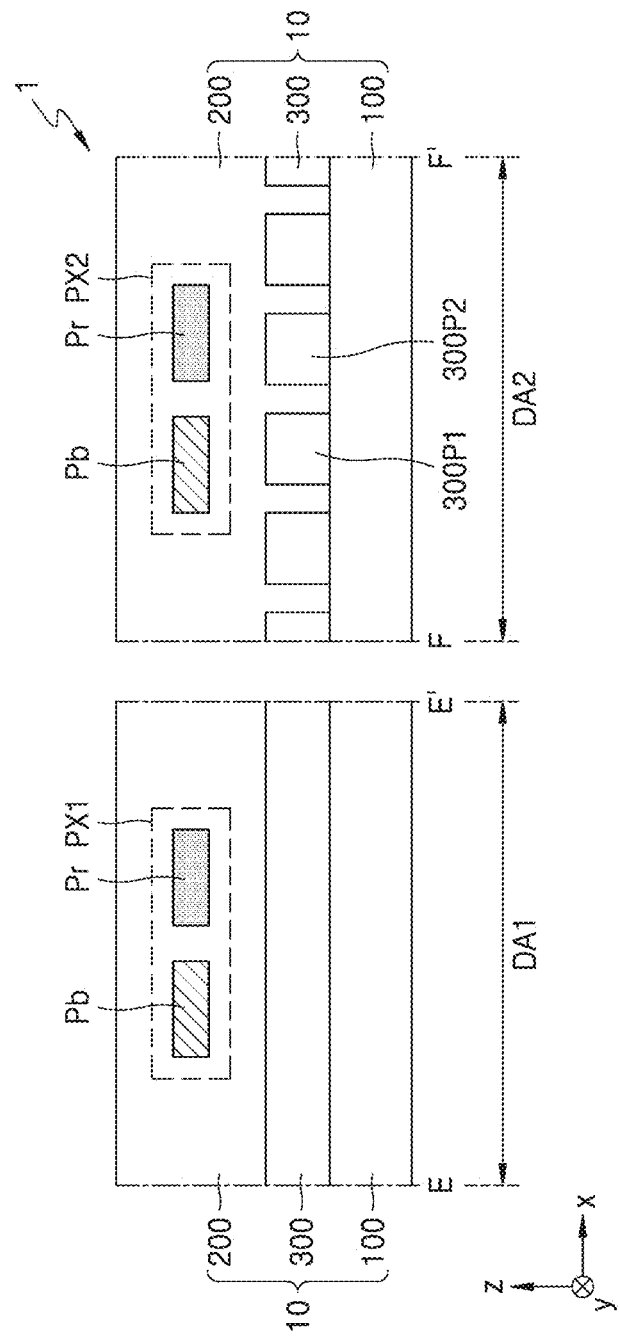

FIGS. 7A and 7B are cross-sectional views of the display apparatus 1 taken along lines E-E' and F-F' of FIG. 6. In FIGS. 7A and 7B, because the same reference numerals as those of FIG. 4 denote the same elements, repeated descriptions thereof are omitted.

Referring to FIGS. 7A and 7B, the display apparatus 1 may include the display panel 10. The display panel 10 may include the first display area DA1 and the second display area DA2. When tensile force is applied, the first elongation rate of the display panel 10 in the first display area DA1 may be different from the second elongation rate of the display panel 10 in the second display area DA2.

The display panel 10 may include the substrate 100, the pixel layer 200, and the inorganic layer 300. The pixel layer 200 may include the first pixel PX1 in the first display area DA1. The pixel layer 200 may include the second pixel PX2 in the second display area DA2. In an embodiment, the first pixel PX1 and the second pixel PX2 may each include a blue sub-pixel Pb, a red sub-pixel Pr, and a green sub-pixel (not shown). The inorganic layer 300 may be arranged between the substrate 100 and the pixel layer 200.

A ratio of the inorganic layer 300 to the display panel 10 in the first display area DA1 may be different from a ratio of the inorganic layer 300 to the display panel 10 in the second display area DA2.

Referring to FIG. 7A, a thickness 300t1 of the inorganic layer 300 in the first display area DA1 may be different from a thickness 300t2 of the inorganic layer 300 in the second display area DA2. In an embodiment, the thickness 300t1 of the inorganic layer 300 in the first display area DA1 may be greater than the thickness 300t2 of the inorganic layer 300 in the second display area DA2. In this case, the first elongation rate of the display panel 10 in the first display area DA1 may be less than the second elongation rate of the display panel 10 in the second display area DA2. In another embodiment, the thickness 300t1 of the inorganic layer 300 in the first display area DA1 may be less than the thickness 300t2 of the inorganic layer 300 in the second display area DA2. In this case, the first elongation rate of the display panel 10 in the first display area DA1 may be greater than the second elongation rate of the display panel 10 in the second display area DA2.

Referring to FIG. 7B, the inorganic layer 300 may be continuously arranged in the first display area DA1. The inorganic layer 300 may include a plurality of inorganic patterns spaced apart from each other in the second display area DA2. In an embodiment, the inorganic layer 300 may include a first inorganic pattern 300P1 and a second inorganic pattern 300P2 spaced apart from each other in the second display area DA2. In this case, the first elongation rate of the display panel 10 in the first display area DA1 may be less than the second elongation rate of the display panel 10 in the second display area DA2. In another embodiment, the inorganic layer 300 in the first display area DA1 may include a plurality of inorganic patterns spaced apart from each other. The inorganic layer 300 may be continuously arranged in the second display area DA2. In this case, the first elongation rate of the display panel 10 in the first display area DA1 may be greater than the second elongation rate of the display panel 10 in the second display area DA2.

The embodiment described with reference to FIGS. 7A and 7B is applicable to the first display area DA1 and the second display area DA2 described with reference to FIGS. 3A to 3C.

Figure 8:
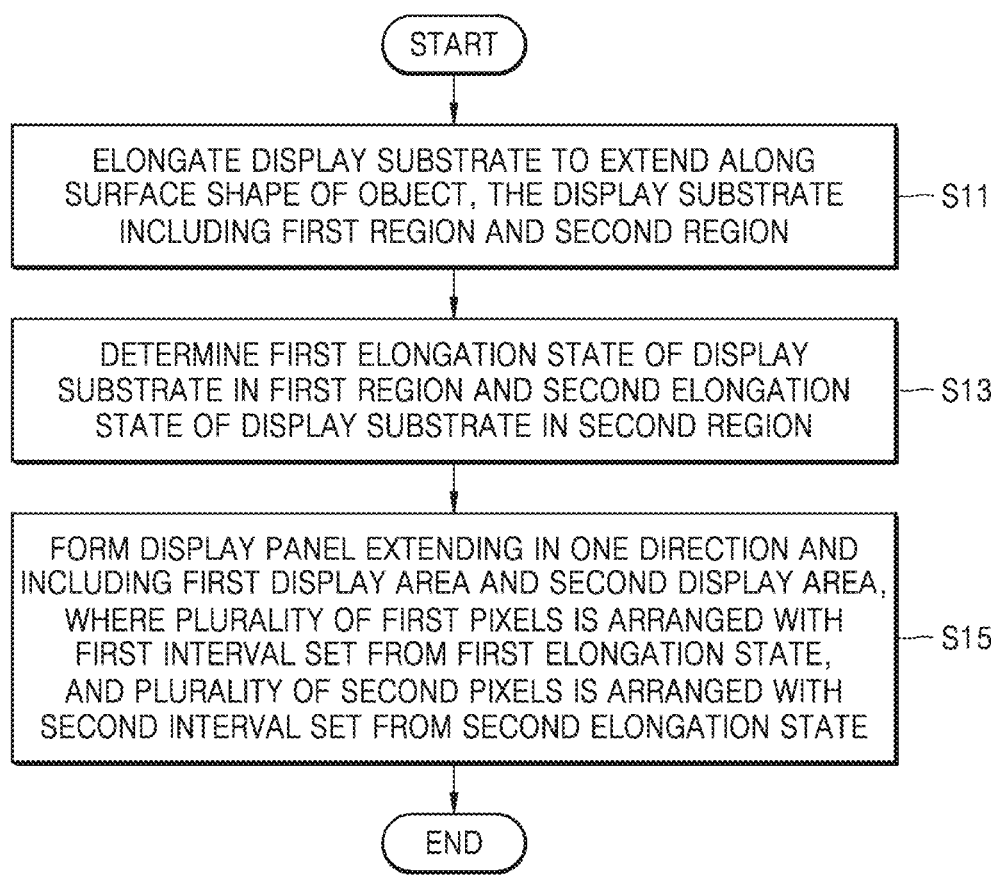
FIG. 8 is a flowchart showing an embodiment of a method of manufacturing a display apparatus.

FIG. 8 is a flowchart showing an embodiment of a method of manufacturing a display apparatus. FIGS. 9A to 9E are cross-sectional views showing an embodiment of a method of manufacturing a display apparatus. In FIGS. 9A to 9E, because the same reference numerals as those of FIG. 1 denote the same elements, repeated descriptions thereof are omitted.

Referring to FIG. 8, the method of manufacturing the display apparatus may include elongating a display substrate to extend along a surface shape of an object, the display substrate including a first region and a second region (S11), determining a first elongation state of the display substrate in the first region and a second elongation state of the display substrate in the second region (S13), and forming a display panel extending in one direction and including a first display area and a second display area, where a plurality of first pixels is arranged with a first interval set from the first elongation state, and a plurality of second pixels is arranged with a second interval set from the second elongation state (S15). Hereinafter, the method of manufacturing the display apparatus is described in detail with reference to FIGS. 9A to 9E.

Figure 9A:
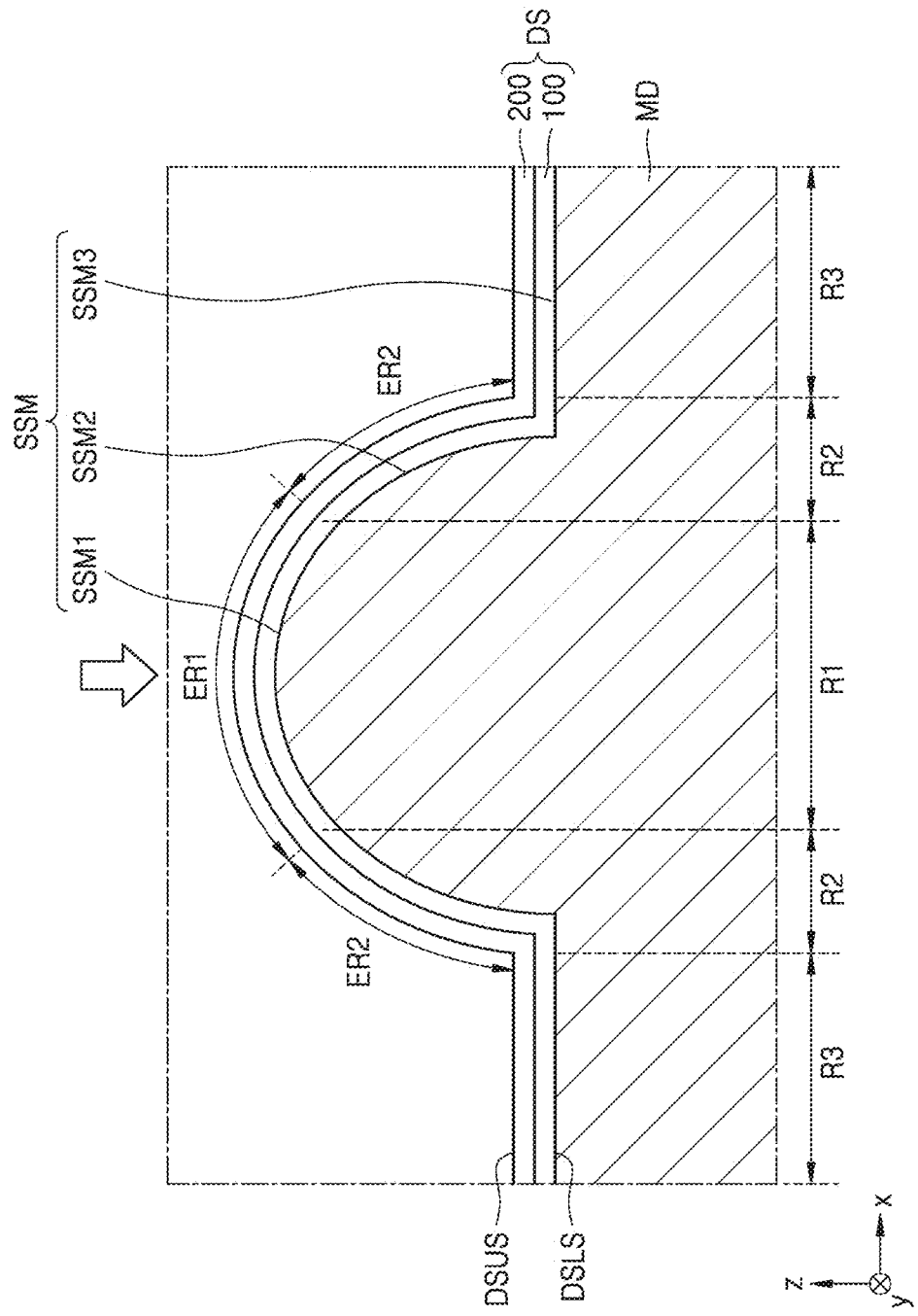

Referring to FIG. 9A, a display substrate DS may be elongated to extend along the surface shape of an object. The display substrate DS may include a first region R1, a second region R2, and a third region R3. The first region R1 may be a region that overlaps a first mold surface SSM1 of a mold MD described below. The second region R2 may be a region that overlaps a second mold surface SSM2 of the mold MD described below. The third region R3 may be a region that overlaps a third mold surface SSM3 of the mold MD described below.

The display substrate DS may include the substrate 100 and the pixel layer 200. In an embodiment, the display substrate DS may further include an inorganic layer (not shown) between the substrate 100 and the pixel layer 200. In an embodiment, the display substrate DS may further include a film layer (not shown) arranged on at least one of an upper surface DSUS of the display substrate DS and a lower surface DSLS of the display substrate DS. The upper surface DSUS of the display substrate DS may be opposite to the lower surface DSLS of the display substrate DS. The display substrate DS may include substantially the same material as that of a display apparatus (not shown) that is manufactured.

In an embodiment, the display substrate DS extending in one direction may be pressed to the mold MD. In an embodiment, the mold MD may face the lower surface DSLS of the display substrate DS. In an embodiment, the mold MD may include a protrusion that protrudes in a predetermined direction (e.g., upper direction in FIG. 9A).

A surface SSM of the mold MD may include a plurality of surfaces. The surface SSM of the mold MD may be substantially the same as the surface SS (refer to FIG. 1) of the object OB (refer to FIG. 1). The plurality of surfaces may each be a partial surface defining a portion of the surface SS of the mold MD. In an embodiment, the surface SSM of the mold MD may include a first mold surface SSM1, a second mold surface SSM2, and a third mold surface SSM3. The first mold surface SSM1 may have a first mold shape. The second mold surface SSM2 may have a second mold shape. The third mold surface SSM3 may have a third mold shape.

In an embodiment, one of the first mold shape, the second mold shape, and the third mold shape may be different from another of the first mold shape, the second mold shape, and the third mold shape. In an embodiment, the first mold surface SSM1 may have a first curvature. The second mold surface SSM2 may have a second curvature. The first curvature of the first mold surface SSM1 may be less or greater than the second curvature of the second mold surface SSM2. The third mold surface SSM3 may be flat. Hereinafter, the case where the surface SSM of the mold MD includes the first mold surface SSM1, the second mold surface SSM2, and the third mold surface SSM3 is mainly described in detail. However, the invention is not limited thereto. The embodiment is applicable to the surface SSM of the mold MD having various shapes.

In an embodiment, the display substrate DS extending in one direction may be transformed to extend along the surface SSM of the mold MD. In an embodiment, the display substrate DS extending in the first direction (e.g., the x-direction or the (−) x-direction) may be transformed to extend along the surface SSM of the mold MD. In an embodiment, the first region R1 may be transformed to extend along the first mold surface SSM1. In this case, the first region R1 may have a first curvature. The second region R2 may be transformed to extend along the second mold surface SSM2. The second region R2 may have a second curvature. The third region R3 may extend along the third mold surface SSM3. The third region R3 may be flat.

The display substrate DS may be elongated on the surface SSM of the mold MD. In an embodiment, the first region R1 may be elongated to a first elongation state ER1. The second region R2 may be elongated to a second elongation state ER2. In this case, a degree in which the display substrate DS in the first region R1 is elongated may be different from a degree in which the display substrate DS in the second region R2 is elongated. In an embodiment, a degree in which the display substrate DS in the first region R1 is elongated may be less than a degree in which the display substrate DS in the second region R2 is elongated.

Figure 9B:
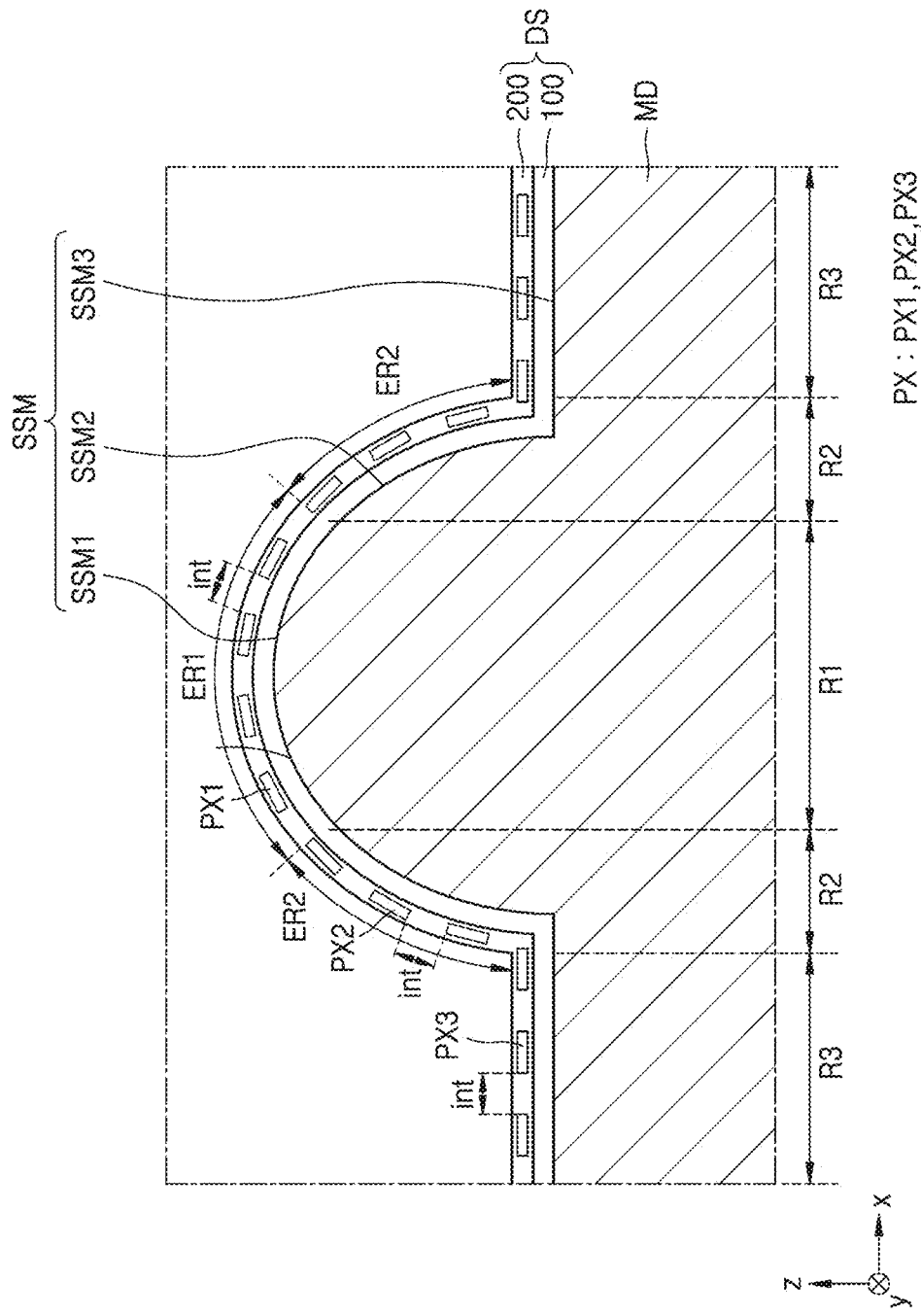

Referring to FIG. 9B, a plurality of pixels PX may be arranged with a constant interval int on the display substrate DS that is transformed. In an embodiment, the plurality of pixels PX may be arranged with a constant interval int in the first region R1, the second region R2, and the third region R3. The constant interval int may be a distance between the plurality of pixels PX that are adjacent in an extension direction of the display substrate DS. In an embodiment, a distance between the first pixels PX1 that are adjacent in the first region R1, a distance between the second pixels PX2 that are adjacent in the second region R2, and a distance between the third pixels PX3 that are adjacent in the third region R3 may be the same.

In an alternative embodiment, the plurality of pixels PX may be arranged on the display substrate DS that is transformed to be uniformly arranged when viewed by a user. In an embodiment, the plurality of pixels PX may be uniformly arranged when the display substrate DS that is transformed is viewed in a z-direction of FIG. 9B.

In an alternative embodiment, the plurality of pixels PX may be arranged on the display substrate DS that is transformed such that the density of the pixels PX is substantially the same. In an embodiment, the pixels PX may be arranged such that the density of the first pixels PX1 in the first region R1, the density of the second pixels PX2 in the second region R2, and the density of the third pixels PX3 in the third region R3 are substantially the same.

The first elongation state ER1 of the display substrate DS in the first region R1 and the second elongation state ER2 of the display substrate DS in the second region R2 may be determined. In an embodiment, a plurality of align marks may be arranged with a preset interval before the display substrate DS is elongated. Next, the display substrate DS is elongated, and then, the positions of the plurality of align marks may be determined. Accordingly, the first elongation state ER1 of the display substrate DS in the first region R1 and the second elongation state ER2 of the display substrate DS in the second region R2 may be determined. Specifically, a degree in which the display substrate DS in the first region R1 is elongated and a degree in which the display substrate DS in the second region R2 is elongated may be determined. In another embodiment, the first elongation state ER1 and the second elongation state ER2 may be determined through computer simulation. In an embodiment, a mesh structure set in advance may be set in the display substrate DS extending in one direction. Next, when the display substrate DS is elongated, the change of the mesh structure may be determined through computer simulation. Accordingly, the first elongation state ER1 of the display substrate DS in the first region R1 and the second elongation state ER2 of the display substrate DS in the second region R2 may be determined.

Figure 9C:
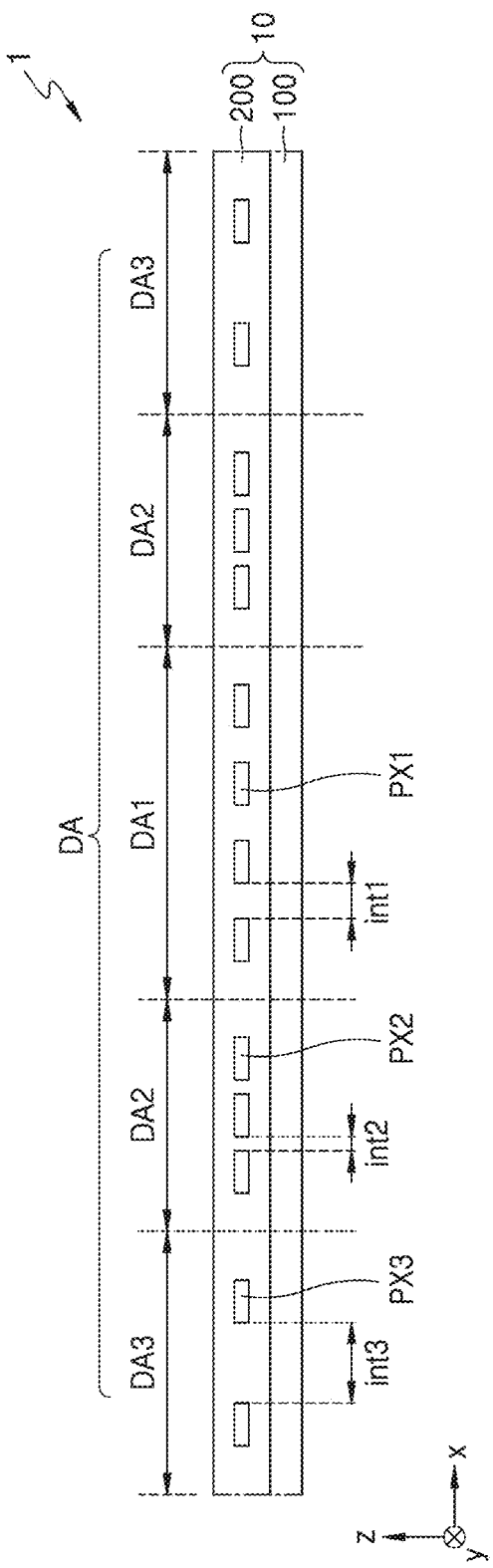

Referring to FIGS. 9B and 9C, the display panel 10 may be provided. The display panel 10 may extend in one direction. In an embodiment, the display panel 10 may extend in the first direction (e.g., the x-direction or the (−) x-direction).

The display panel 10 may include the display area DA. The display area DA may include the first display area DA1, the second display area DA2, and the third display area DA3. The plurality of pixels may be arranged in the display area DA. The plurality of pixels PX may include the first pixel PX1, the second pixel PX2, and the third pixel PX3. The first pixel PX1 may be arranged in the first display area DA1. The second pixel PX2 may be arranged in the second display area DA2. The third pixel PX3 may be arranged in the third display area DA3.

The first pixel PX1 may be provided in plural in the first display area DA1. The plurality of first pixels PX1 may be arranged with a first interval int1 in the first display area DA1. The first interval int1 may be set from the first elongation state ER1. In an embodiment, for the plurality of first pixels PX1 to be arranged with a constant interval int in the display panel 10 that is elongated along the surface shape of an object, the first interval int1 may be reduced by a ratio in which the display substrate DS is elongated in the first region R1 compared to the constant interval int. Accordingly, the first pixels PX1 may be arranged with the first interval int1 in the display panel 10 in one direction. Such description is applicable to not only the first direction (e.g., the x-direction or the (−) x-direction), but also the second direction (e.g., the y-direction or the (−) y-direction) and/or a third direction (e.g. a z-direction or a (−) z-direction).

The second pixel PX2 may be provided in plural in the second display area DA2. The plurality of second pixels PX2 may be arranged with a second interval int2 in the second display area DA2. The second interval int2 may be set from the second elongation state ER2. In an embodiment, for the plurality of second pixels PX2 to be arranged with a constant interval int in the display panel 10 that is elongated along the surface shape of an object, the second interval int2 may be reduced by a ratio in which the display substrate DS is elongated in the first region R1 compared to the constant interval int. Accordingly, the second pixels PX2 may be arranged with the second interval int2 in the display panel 10 in one direction. In an embodiment, the second interval int2 may be less than the first interval int1. Such description is applicable to not only the first direction (e.g., the x-direction or the (−) x-direction), but also the second direction (e.g., the y-direction or the (−) y-direction) and/or the third direction (e.g. the z-direction or the (−) z-direction).

The third pixel PX3 may be provided in plural in the third display area DA3. The plurality of third pixels PX3 may be arranged with a third interval int3 in the third display area DA3. In the case where the third display area DA3 is not elongated, the third interval int3 may be substantially the same as the constant interval int.

In other words, the densities of the plurality of pixels PX in the display area DA may be different depending on the position of the pixels PX inside the display area DA. In an embodiment, the density of the first pixels PX1 in the first display area DA1, the density of the second pixels PX2 in the second display area DA2, and the density of the third pixels PX3 in the third display area DA3 are be different from one another.

Figure 9D:
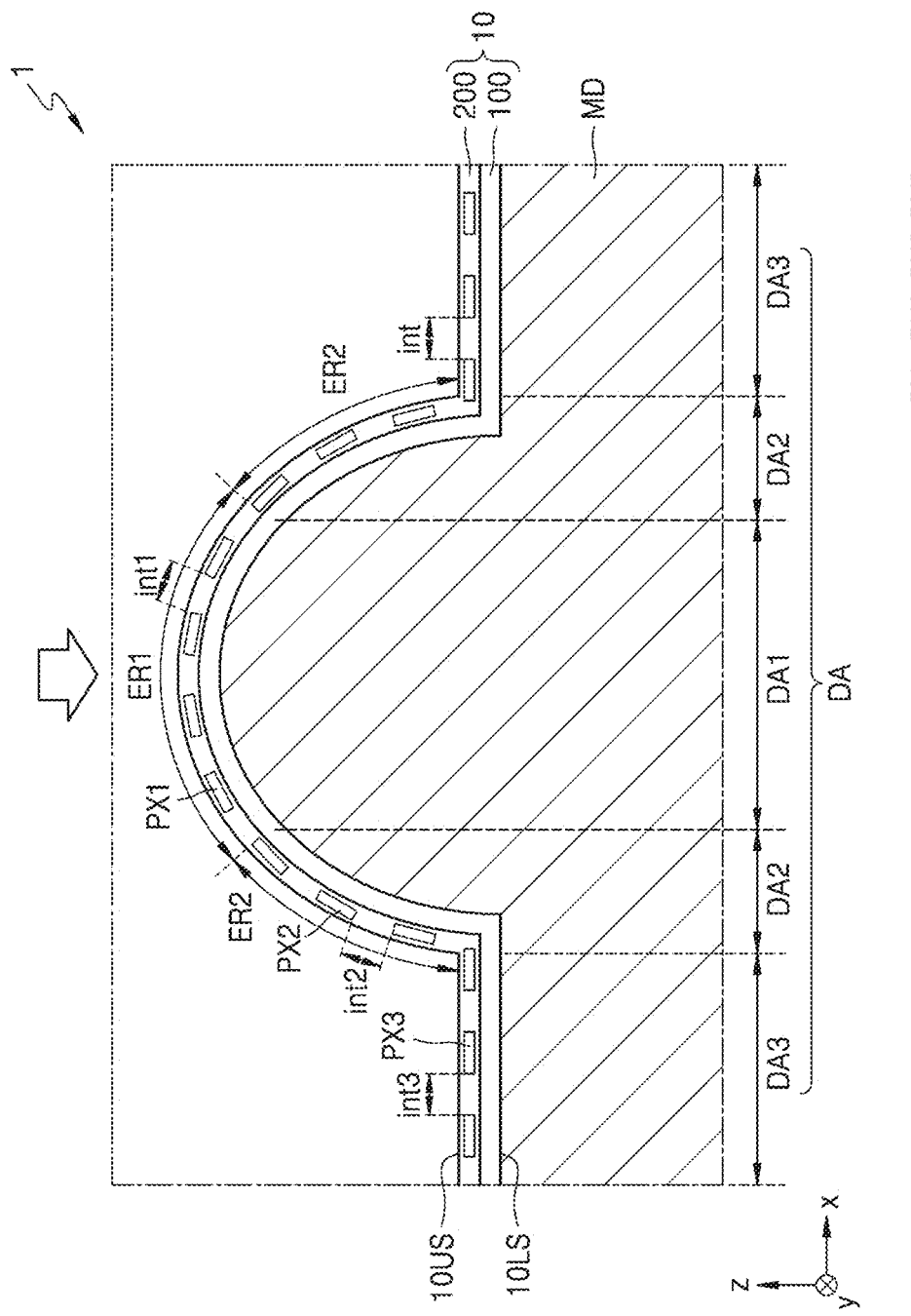

Referring to FIG. 9D, the display panel 10 may be transformed to extend along the surface shape of the object. In an embodiment, the display panel 10 may be transformed by the mold MD having substantially the same surface shape as the surface shape of an object.

The mold MD may face one of the upper surface 10US of the display panel 10 and the lower surface 10LS of the display panel 10. The upper surface 10US of the display panel 10 may be an upper surface of the pixel layer 200. The lower surface 10LS of the display panel 10 may be a lower surface of the substrate 100. In an embodiment, the mold MD may face the lower surface 10LS of the display panel 10.

The first interval int1 and the second interval int2 may be changed to be the same as each other. In an embodiment, the first display area DA1 may be elongated to the first elongation state ER1, and the first interval int1 between the first pixels PX1 that are adjacent to each other may be changed. In an embodiment, the second display area DA2 may be elongated to the second elongation state ER2, and the second interval int2 between the second pixels PX2 that are adjacent to each other may be changed. The first interval int1 and the second interval int2 are values by respectively taking into account the first elongation state ER1 and the second elongation state ER2, and may be changed to a constant interval int. In an embodiment, the third display area DA3 may not be elongated. Accordingly, an interval between the third pixels PX3 that are adjacent to each other may be maintained as the third interval int3. In an embodiment, the plurality of first pixels PX1, the plurality of second pixels PX2, and the plurality of third pixels PX3 may each be arranged with a constant interval int in the display panel 10 that is elongated.

In an embodiment, the first elongation state ER1 may be one of a relatively high elongation state and a relatively low elongation state, and the second elongation state ER2 may be the other of the relatively high elongation state and the relatively low elongation state. In an embodiment, the first elongation state ER1 may be the relatively high elongation state. The second elongation state ER2 may be the relatively low elongation state.

Referring to FIG. 9E, the display apparatus 1 may be arranged on the object OB. In an embodiment, the first elongation state of the display substrate DS in the first region R1 and the second elongation state of the display substrate DS in the second region R2 may be determined, and the first interval int1 and the second interval int2 may be respectively set from the first elongation state ER1 and the second elongation state ER2. In addition, the display panel 10 may extend in one direction and include the plurality of first pixels PX1 and the plurality of second pixels PX2 respectively spaced apart from each other with the first interval int1 and the second interval int2.

Next, the display panel 10 extending in one direction is transformed, and the display apparatus 1 having a uniform pixel arrangement may be arranged on the surface of the object OB having various shapes. Accordingly, the plurality of pixels arranged on the surface of the object OB may be entirely or substantially prevented from being viewed to a user as being non-uniformly arranged.

Figure 10A:
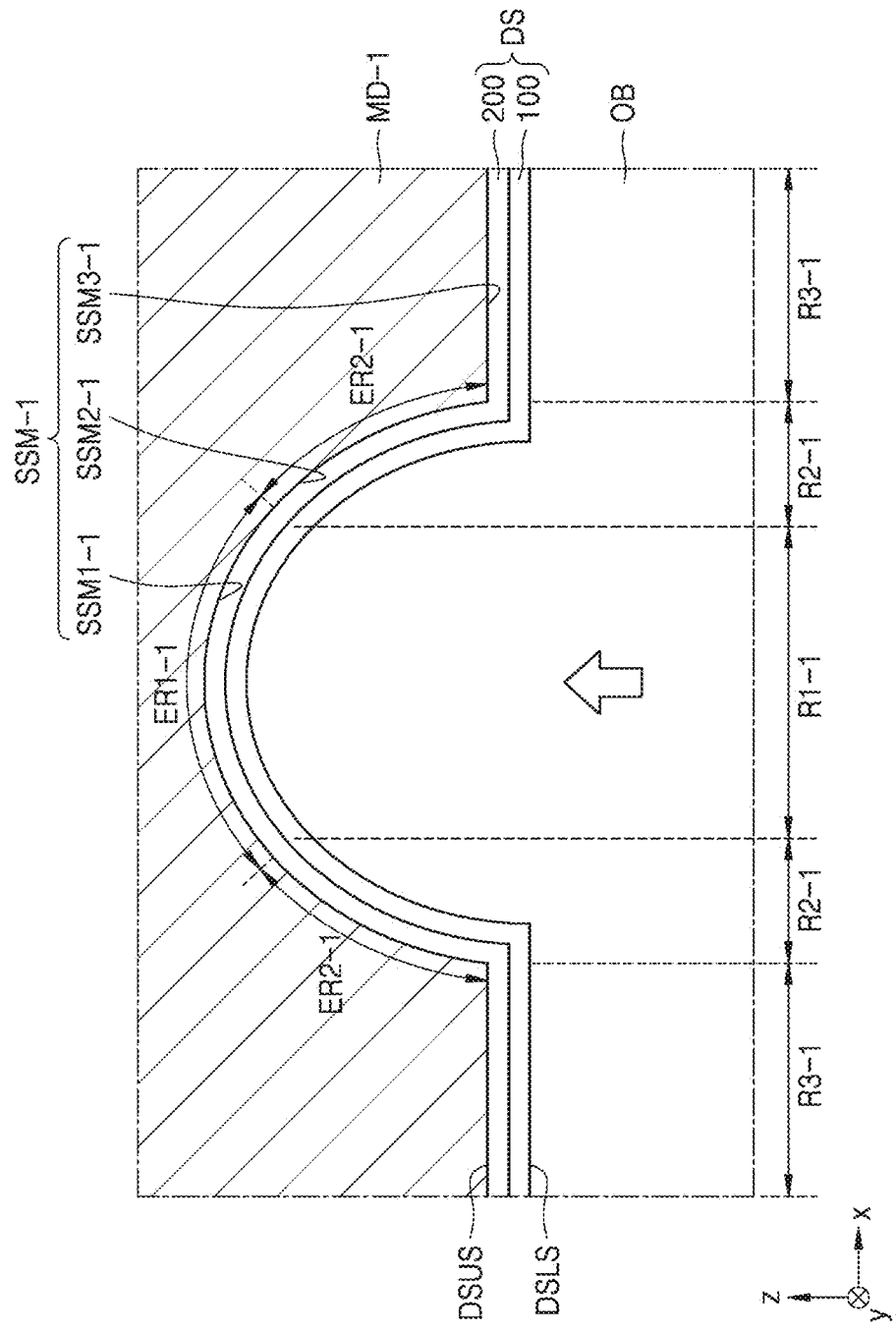
FIGS. 10A and 10B are cross-sectional views showing another embodiment of a method of manufacturing a display apparatus.
Figure 10B:
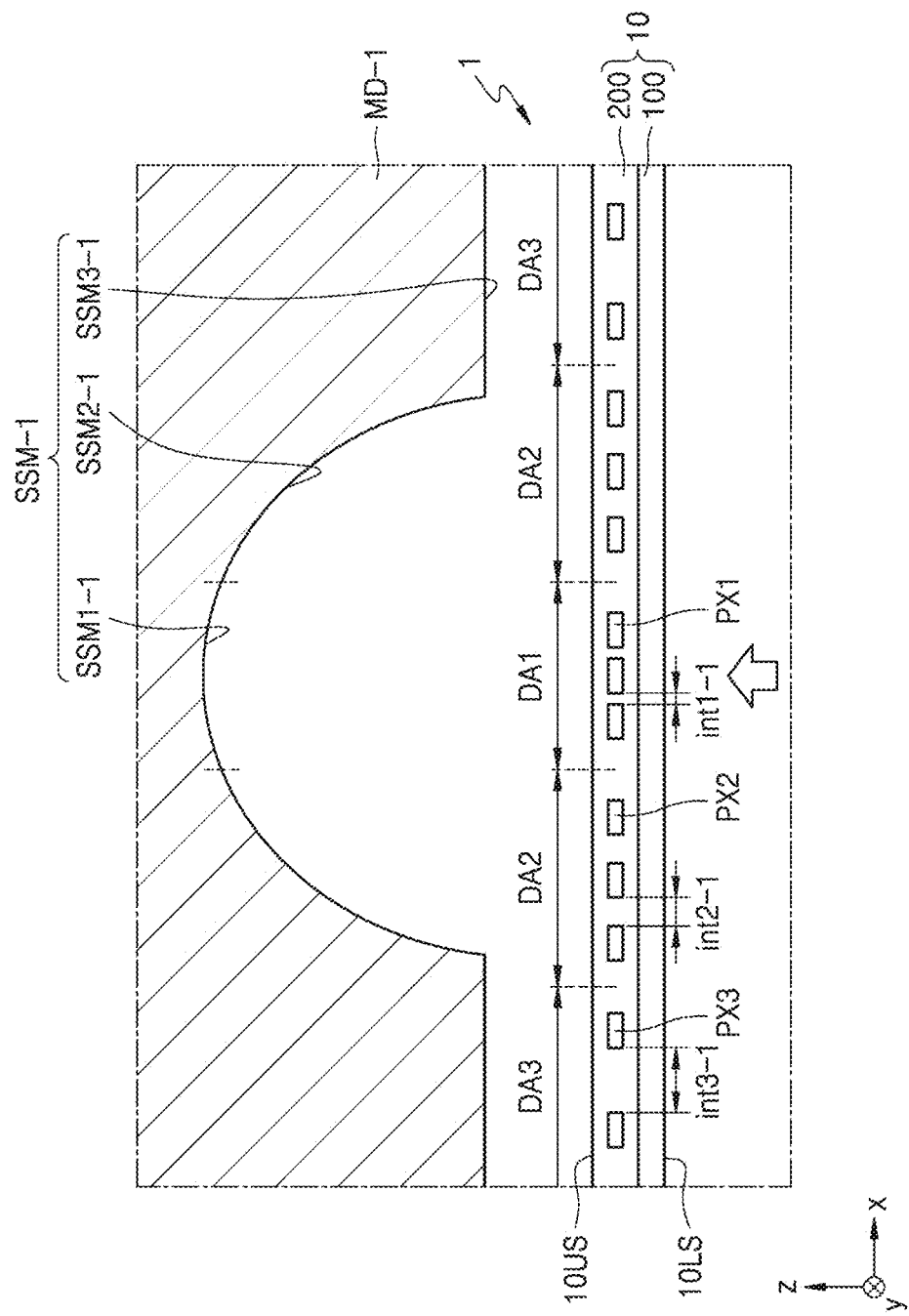

FIGS. 10A and 10B are cross-sectional views showing another embodiment of a method of manufacturing a display apparatus. In FIGS. 10A and 10B, because the same reference numerals as those of FIGS. 9A to 9E denote the same elements, repeated descriptions thereof are omitted.

Referring to FIG. 10A, the display substrate DS may be elongated to extend along the surface shape of an object. The display substrate DS may include a first region R1-1, a second region R2-1, and a third region R3-1. Because the first region R1-1, the second region R2-1, and the third region R3-1 are the same as or similar to the first region R1, the second region R2, and the third region R3 of FIG. 9A, repeated descriptions thereof are omitted.

In an embodiment, the display substrate DS extending in one direction may be pressed to a mold MD-1. In an embodiment, the mold MD-1 may face the upper surface DSUS of the display substrate DS. The upper surface DSUS of the display substrate DS may be an upper surface of the pixel layer 200. In an embodiment, a concave portion that is dented in a predetermined direction (e.g., upper direction in FIG. 10A) may be defined in the mold MD-1.

A surface SSM-1 of the mold MD-1 may include a plurality of surfaces. In an embodiment, the surface SSM-1 of the mold MD-1 may have a shape that is dented to transform the shape of the display substrate DS such that the display substrate DS is arranged on the surface SS (refer to FIG. 1) of the object OB (refer to FIG. 1). In an embodiment, the surface SSM-1 of the mold MD-1 may include a first mold surface SSM1-1, a second mold surface SSM2-1, and a third mold surface SSM3-1.

In an embodiment, the display substrate DS extending in one direction may be transformed to extend along the surface SSM-1 of the mold MD-1. In an embodiment, the display substrate DS extending in the first direction (e.g., the x-direction or the (−) x-direction) may be transformed to extend along the surface SSM-1 of the mold MD-1.

The display substrate DS may be elongated on the surface SSM-1 of the mold MD-1. In an embodiment, the first region R1-1 may be elongated to a first elongation state ER1-1. The second region R2-1 may be elongated to a second elongation state ER2-1. In this case, the first elongation state ER1-1 may be different from the second elongation state ER2-1. In an embodiment, a degree in which the display substrate DS in the first region R1-1 is elongated may be greater than a degree in which the display substrate DS in the second region R2-1 is elongated.

Next, the plurality of pixels may be arranged with a constant interval on the display substrate DS that is transformed, and the first elongation state ER1-1 of the display substrate DS in the first region R1-1 and the second elongation state ER2-1 of the display substrate DS in the second region R2-1 may be determined.

Referring to FIG. 10B, the display panel 10 may be provided. The display panel 10 may extend in one direction.

In an embodiment, the display panel 10 may extend in the first direction (e.g., the x-direction or the (−) x-direction). The display area DA may include the first display area DA1, the second display area DA2, and the third display area DA3.

The first pixel PX1 may be provided in plural in the first display area DA1. The plurality of first pixels PX1 may be arranged with a first interval int1-1 in the first display area DA1. The first interval int1-1 may be set from the first elongation state ER1-1.

The second pixel PX2 may be provided in plural in the second display area DA2. The plurality of second pixels PX2 may be arranged with a second interval int2-1 in the second display area DA2. The second interval int2-1 may be set from the second elongation state ER2-1.

In an embodiment, the second interval int2-1 may be greater than the first interval int1-1.

The third pixel PX3 may be provided in plural in the third display area DA3. The plurality of third pixels PX3 may be arranged with a third interval int3-1 in the third display area DA3.

Next, the display panel 10 may be transformed to extend along the surface shape of an object. In an embodiment, the display panel 10 that extends in one direction may be transformed by the mold MD-1.

The mold MD-1 may face one of the upper surface 10US of the display panel 10 and the lower surface 10LS of the display panel 10. In an embodiment, the mold MD-1 may face the upper surface 10US of the display panel 10. The upper surface 10US of the display panel 10 may be the upper surface of the pixel layer 200.

The first interval int1-1 and the second interval int2-1 may be changed to be the same as each other. In an embodiment, the first display area DA1 may be elongated to a first elongation state ER1-1, and the first interval int1-1 between the first pixels PX1 that are adjacent to each other may be changed. In an embodiment, the second display area DA2 may be elongated to the second elongation state ER2-1, and the first interval int2-1 between the second pixels PX1 that are adjacent to each other may be changed. The first interval int1-1 and the second interval int2-1 are values by respectively taking into account the first elongation state ER1-1 and the second elongation state ER2-1, and the first interval int1-1 and the second interval int2-1 may be changed into a constant interval. In an embodiment, the third display area DA3 may not be elongated. Accordingly, an interval between the third pixels PX3 that are adjacent to each other may be maintained as the third interval int3-1. In an embodiment, the plurality of first pixels PX1, the plurality of second pixels PX2, and the plurality of third pixels PX3 may each be arranged at a constant interval in the display panel 10 that is elongated.

In an embodiment, the first elongation state ER1-1 may be one of a relatively high elongation state and a relatively low elongation state, and the second elongation state ER2-1 may be the other of the relatively high elongation state and the relatively low elongation state. In an embodiment, the first elongation state ER1-1 may be in the relatively low elongation state. The second elongation state ER2-1 may be in the relatively high elongation state.

The method of manufacturing the display apparatus described with reference to FIGS. 10A and 10B is different from the method of manufacturing the display apparatus described with reference to FIGS. 9A to 9E in that the surface of the display panel 10 that faces the mold is selected as one of the upper surface 10US of the display panel 10 and the lower surface 10LS of the display panel 10. The first elongation state of the first display area DA1 and the second elongation state of the second display area DA2 may be different depending on each method, and pixel arrangement may be different when the display panel 10 that extends in one direction is provided.

In an embodiment, an elongation state of each region may be determined from the display substrate DS that is transformed, and the pixels may be provided in each region with a pixel interval set from the elongation state. Accordingly, whatever method is used, intervals between pixels that are adjacent to each other in the display panel that extends along the shape of an object may be substantially the same.

Figure 11:
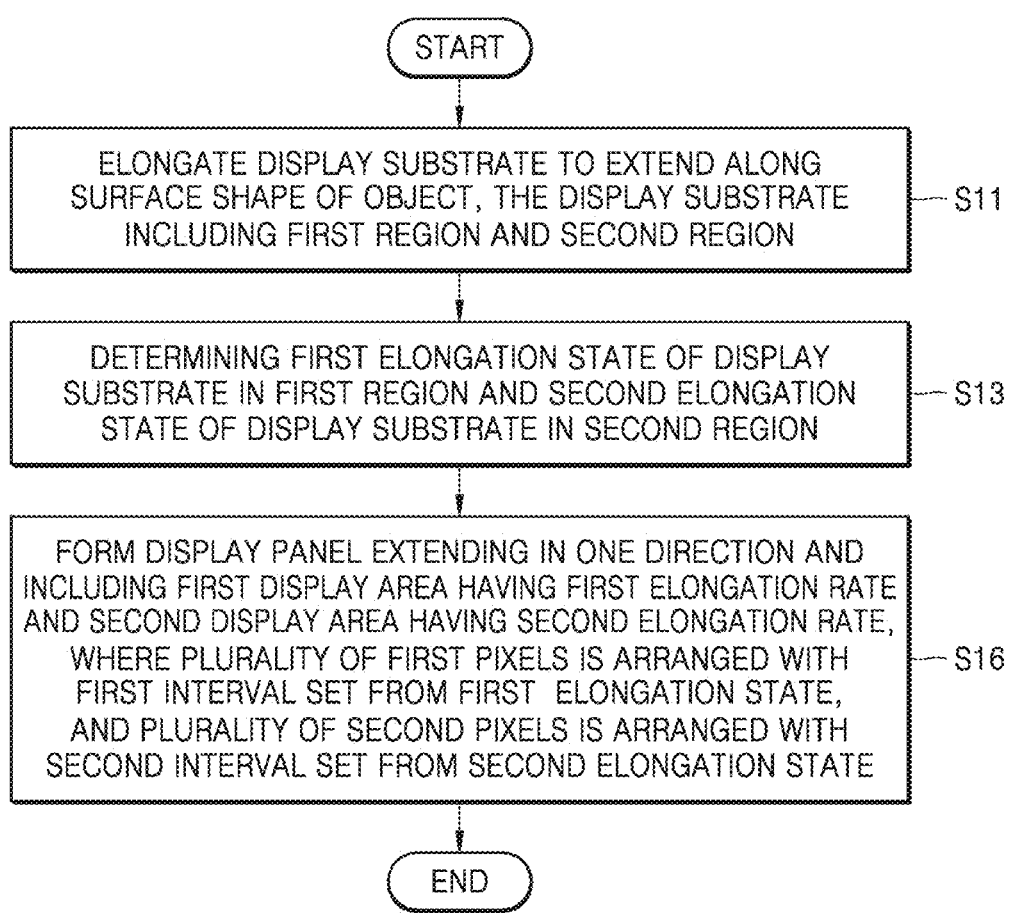
FIG. 11 is a flowchart showing another embodiment of a method of manufacturing a display apparatus.

FIG. 11 is a flowchart showing an embodiment of a method of manufacturing a display apparatus.

Referring to FIG. 11, the method of manufacturing the display apparatus may include elongating a display substrate to extend along a surface shape of an object, the display substrate including a first region and a second region (S11), determining a first elongation state of the display substrate in the first region and a second elongation state of the display substrate in the second region (S13), and forming a display panel extending in one direction, the display panel including a first display area having a first elongation rate and a second display area having a second elongation rate, where a plurality of first pixels is arranged with a first interval set from the first elongation state, and a plurality of second pixels is arranged with a second interval set from the second elongation state (S16).

In an embodiment, the display panel may be provided such that the first display area has the first elongation rate and the second display area has the second elongation rate when tensile force is applied. In an embodiment, the first elongation rate may be determined based on the structure of the display panel in the first display area and/or the material of the display panel in the first display area. In addition, the second elongation rate may be determined based on the structure of the display panel in the second display area and/or the material of the display panel in the second display area. In an embodiment, as in the embodiment described with reference to FIGS. 3A to 3C, the display panel may be provided such that the structure of the first display area DA1 is different from the structure of the second display area DA2.

In another embodiment, as in the embodiment described with reference to FIG. 4, the display panel may be provided such that the elongation rate of the substrate 100 in the first display area DA1 is different from the elongation rate of the substrate 100 in the second display area DA2 when tensile force is applied.

In another embodiment, as in the embodiment described with reference to FIGS. 6, 7A, and 7B, the display panel may be provided such that a kind of the material of the display panel 10 in the first display area DA1 is different from a kind of the material of the display panel 10 in the second display area DA2.

Accordingly, even though the display panel extends along the surface of an object, an interval between the plurality of pixels that are adjacent to each other may be maintained as constant.

Figure 12:
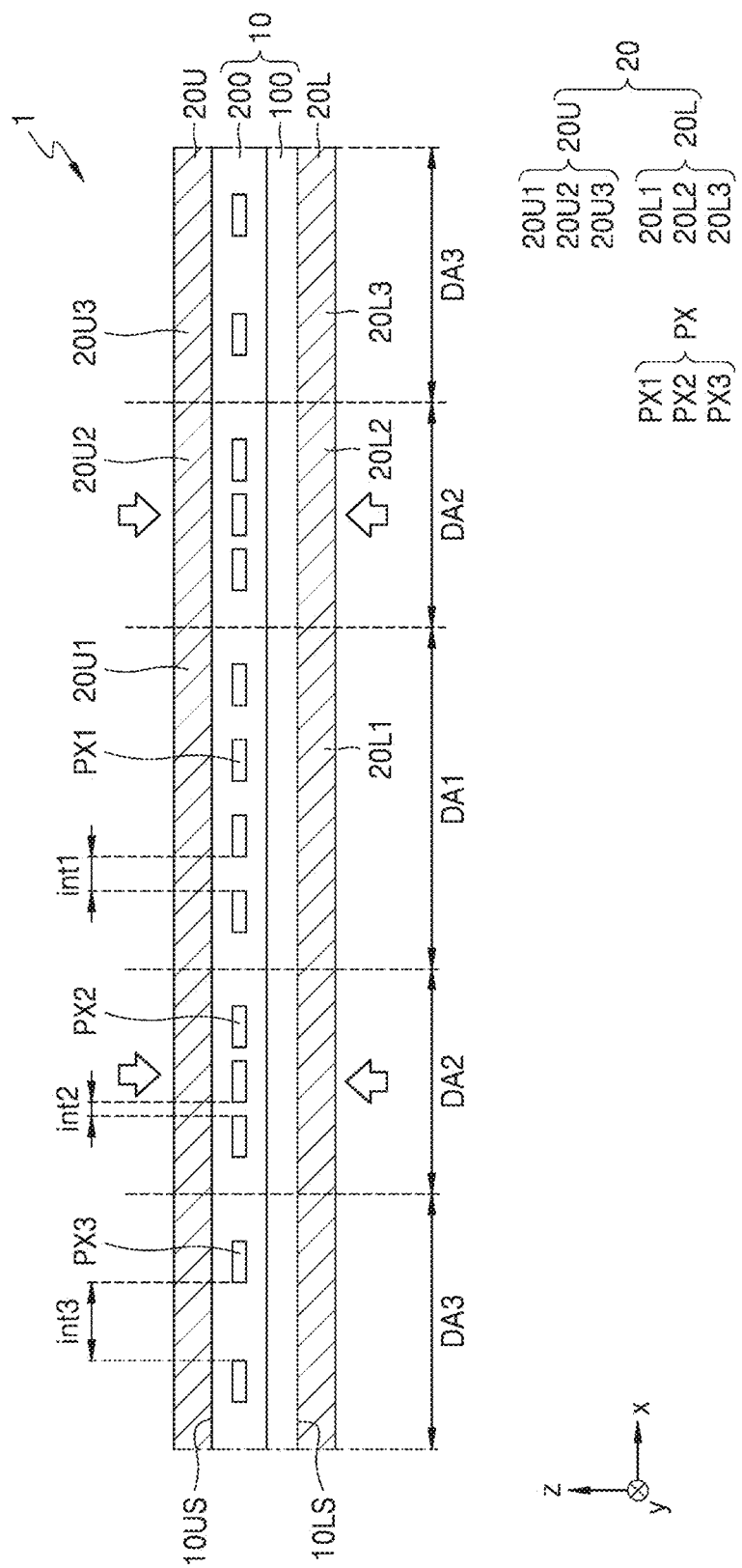
FIG. 12 is a cross-sectional view showing an embodiment of a method of manufacturing a display apparatus.

FIG. 12 is a cross-sectional view showing an embodiment of a method of manufacturing a display apparatus. In FIG. 12, because the same reference numerals as those of FIG. 9C denote the same elements, repeated descriptions thereof are omitted.

Referring to FIG. 12, the display panel 10 may be provided. The display panel 10 may extend in one direction.

In an embodiment, the display panel 10 may extend in the first direction (e.g., the x-direction or the (−) x-direction).

The display panel 10 may include the display area DA. The display area DA may include the first display area DA1, the second display area DA2, and the third display area DA3.

The plurality of pixels PX may include the first pixel PX1, the second pixel PX2, and the third pixel PX3. The first pixel PX1 may be arranged in the first display area DA1. The plurality of first pixels PX1 may be arranged with the first interval int1 in the first display area DA1. The second pixel PX2 may be arranged in the second display area DA2. The plurality of second pixels PX2 may be arranged with the second interval int2 in the second display area DA2. The third pixel PX3 may be arranged in the third display area DA3. The plurality of third pixels PX3 may be arranged with the third interval int3 in the third display area DA3.

In an embodiment, the film layer 20 may be attached to at least one of the upper surface 10US of the display panel 10 and the lower surface 10LS of the display panel 10. In an embodiment, the upper film layer 20U may be attached to the upper surface 10US of the display panel 10, and the lower film layer 20L may be attached to the lower surface 10LS of the display panel 10. In another embodiment, the upper film layer 20U may be attached to the upper surface 10US of the display panel 10, and the lower film layer 20L may not be attached to the lower surface 10LS of the display panel 10. In another embodiment, the upper film layer 20U may not be attached to the upper surface 10US of the display panel 10, and the lower film layer 20L may be attached to the lower surface 10LS of the display panel 10. Hereinafter, the case where both the upper film layer 20U and the lower film layer 20L are attached to the display panel 10 is mainly described in detail.

In an embodiment, the film layer 20 that overlaps the first display area DA1 may include the first upper film layer 20U1 and the first lower film layer 20L1. In an embodiment, the film layer 20 that overlaps the second display area DA2 may include the second upper film layer 20U2 and the second lower film layer 20L2. In an embodiment, the film 20 that overlaps the third display area DA3 may include a third upper film layer 20U3 and a third lower film layer 20L3.

In an embodiment, the elongation rate of the film layer 20 that overlaps the first display area DA1, the elongation rate of the film layer 20 that overlaps the second display area DA2, and the elongation rate of the film layer 20 that overlaps the third display area DA3 may be different from one another. In an embodiment, the elongation rate of the film layer 20 that overlaps the first display area DA1 may be greater than the elongation rate of the film layer 20 that overlaps the second display area DA2. In addition, the elongation rate of the film layer 20 that overlaps the second display area DA2 may be greater than the elongation rate of the film layer 20 that overlaps the third display area DA3. The elongation rate of the film layer 20 may be changed depending on temperature during a process of forming the film layer 20, a material composition of the film layer 20, and a condition under which the film layer 20 is hardened.

In another embodiment, the elongation rate of the film layer 20 that overlaps the first display area DA1, the elongation rate of the film layer 20 that overlaps the second display area DA2, and the elongation rate of the film layer 20 that overlaps the third display area DA3 may be substantially the same.

In an embodiment, the shape of the film layer 20 that overlaps the first display area DA1, the shape of the film layer 20 that overlaps the second display area DA2, and the shape of the film layer 20 that overlaps the third display area DA3 may be different from one another. In an embodiment, a groove or a hole may be defined in at least one of the film layer 20 that overlaps the first display area DA1, the film layer 20 that overlaps the second display area DA2, and the film layer 20 that overlaps the third display area DA3.

In an embodiment, the material of the film layer 20 that overlaps the first display area DA1, the material of the film layer 20 that overlaps the second display area DA2, and the material of the film layer 20 that overlaps the third display area DA3 may be different from one another. In an embodiment, one of the material of the film layer 20 that overlaps the first display area DA1 and the material of the film layer 20 that overlaps the second display area DA2 may include an additive.

In an embodiment, the modulus of the film layer 20 that overlaps the first display area DA1, the modulus of the film layer 20 that overlaps the second display area DA2, and the modulus of the film layer 20 that overlaps the third display area DA3 may be different from one another. In an embodiment, in the case where the second interval int2 is less than the first interval int1, the modulus of the film layer 20 that overlaps the second display area DA2 may be less than the modulus of the film layer 20 that overlaps the first display area DA1. In the case where the first interval int1 is less than the third interval int3, the modulus of the film layer 20 that overlaps the second display area DA2 may be less than the modulus of the film layer 20 that overlaps the third display area DA3.

The film layer 20 is attached to the display panel 10, and then the film layer 20 arranged on one of the first display area DA1 and the second display area DA2 may be processed. In an embodiment, the film layer 20 arranged on one of the first display area DA1 and the second display area DA2 may be additionally processed by heat, pressure, and/or external force.

In an embodiment, an additional process of increasing the elongation rate of the film layer 20 arranged in one of the first display area DA1 and the second display area DA2 may be performed, and an additional process of reducing the elongation rate of the film layer 20 arranged in the other of the first display area DA1 and the second display area DA2 may be performed.

In an embodiment, at least one of the second lower film layer 20L2 and the second upper film layer 20U2 may be processed. In an embodiment, a groove or a hole may be defined in at least one of the second lower film layer 20L2 and the second upper film layer 20U2. In this case, the elongation rate of the second lower film layer 20L2 and the second upper film layer 20U2 may be improved.

In an embodiment, the display panel 10 including the first display area DA1 and the second display area DA2 is provided. The first pixels PX1 spaced apart from each other with the first interval int1 may be arranged in the first display area DA1, and the second pixels PX2 spaced apart from each other with the second interval int2 may be arranged in the second display area DA2. Then, the film layer 20 may be attached to the display panel 10. In this case, the elongation rate of the display apparatus 1 including the display panel 10 and the film layer 20 may be reduced. The elongation of the second display area DA2 that is desired to have a high elongation rate may be reduced, and when the display apparatus 1 is transformed along the shape of an object, the pixels PX may not be uniformly arranged, for example. In an embodiment, at least a portion of the film layer 20 is additionally processed, and thus, the elongation rate of the display apparatus 1 may be improved. Accordingly, when the display apparatus 1 is transformed along the shape of an object, the pixels PX may be uniformly arranged. In an embodiment, when the film layer 20 is additionally processed, the display panel 10 may be additionally processed.

Figure 13:
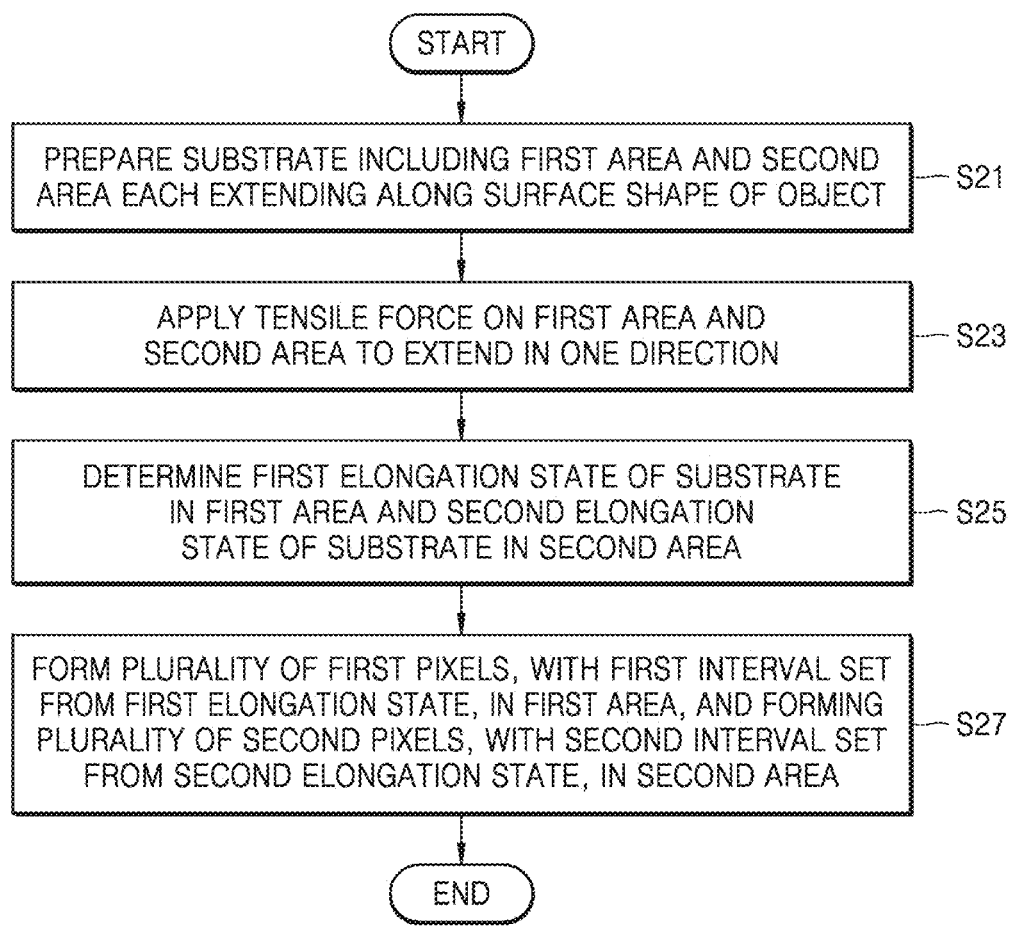
FIG. 13 is a flowchart showing another embodiment of a method of manufacturing a display apparatus.

FIG. 13 is a flowchart showing another embodiment of a method of manufacturing a display apparatus. FIGS. 14A to 14D are cross-sectional views showing another embodiment of a method of manufacturing a display apparatus. In FIGS. 14A to 14D, because the same reference numerals as those of FIGS. 9A to 9E denote the same elements, repeated descriptions thereof are omitted.

Referring to FIG. 13, the method of manufacturing the display apparatus may include preparing a substrate including a first area and a second area each extending along a surface shape of an object (S21), applying tensile force on the first area and the second area to extend in one direction (S23), determining a first elongation state of the substrate in the first area and a second elongation state of the substrate in the second area (S25), and forming a plurality of first pixels, with a first interval set from the first elongation state, in the first area, and forming a plurality of second pixels, with a second interval set from the second elongation state, in the second area (S27). Hereinafter, the method of manufacturing the display apparatus is described in detail with reference to FIGS. 14A to 14D.

Figure 14A:
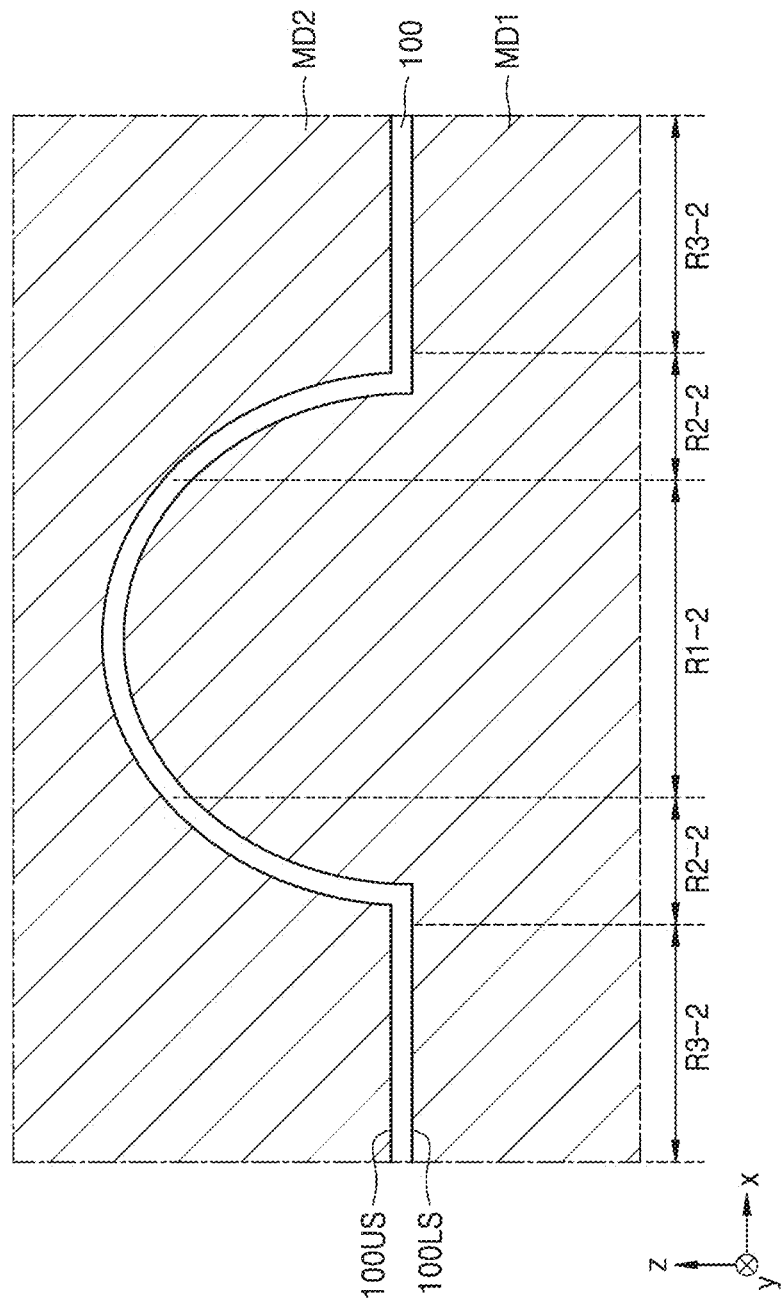

Referring to FIG. 14A, the substrate 100 may be prepared. The substrate 100 may extend along the surface shape of an object. In an embodiment, the substrate 100 may include an upper surface 100US of the substrate 100 and a lower surface 100LS of the substrate 100. The upper surface 100US of the substrate 100 may be opposite to the lower surface 100LS of the substrate 100.

The substrate 100 may be pressed to a first mold MD1 and a second mold MD2. In an embodiment, the first mold MD1 may face the lower surface 100LS of the substrate 100. The lower surface 100LS of the substrate 100 may extend along the surface of the first mold MD1. In an embodiment, the first mold MD1 may include a protrusion portion that protrudes in a predetermined direction (e.g., upper direction in FIG. 14A).

In an embodiment, the second mold MD2 may face the upper surface 100US of the substrate 100. The upper surface 100US of the substrate 100 may extend along the surface of the second mold MD2. In an embodiment, a concave portion that is dented in a predetermined direction (e.g., upper direction in FIG. 14A) may be defined in the second mold MD2. The concave portion may overlap the protrusion portion.

The substrate 100 may include a first region R1-2, a second region R2-2, and a third region R3-2. In an embodiment, the first region R1-2 may have a first curvature. The second region R2-2 may have a second curvature. The third region R3-2 may be flat. In an embodiment, because the shape of the substrate 100 itself extends along the surface shape of an object, the substrate 100 may not be elongated.

Referring to FIG. 14B, tensile force may be applied to the substrate 100. Accordingly, the substrate 100 may be transformed to extend in one direction. In an embodiment, the substrate 100 may be transformed to extend in one direction from a shape extending along the surface shape of an object. In an embodiment, the substrate 100 may extend in the first direction (e.g., the x-direction or the (−) x-direction).

The first region R1-2, the second region R2-2, and the third region R3-2 may be transformed to extend in one direction. In an embodiment, the first region R1-2, the second region R2-2, and the third region R3-2 may be transformed to be flat.

Next, a first elongation state ER1-2 of the substrate 100 in the first region R1-2 and a second elongation state ER2-2 of the substrate 100 in the second region R2-2 may be determined. In an embodiment, a plurality of align marks may be arranged with a preset interval before the substrate 100 is elongated. Next, the substrate 100 is elongated, and then the positions of the plurality of align marks may be determined. Accordingly, the first elongation state ER1-2 of the substrate 100 in the first region R1-2 and the second elongation state ER2-2 of the substrate 100 in the second region R2-2 may be determined. Specifically, a degree in which the substrate 100 in the first region R1-2 is elongated and a degree in which the substrate 100 in the second region R2-2 is elongated may be determined. In another embodiment, the first elongation state ER1-2 and the second elongation state ER2-2 may be determined through computer simulation. In an embodiment, a preset mesh structure may be set to the substrate 100. Next, when the substrate 100 is elongated, a change in the mesh structure may be determined through computer simulation. Accordingly, the first elongation state ER1-2 of the substrate 100 in the first region R1-2 and the second elongation state ER2-2 of the substrate 100 in the second region R2-2 may be determined.

Figure 14C:
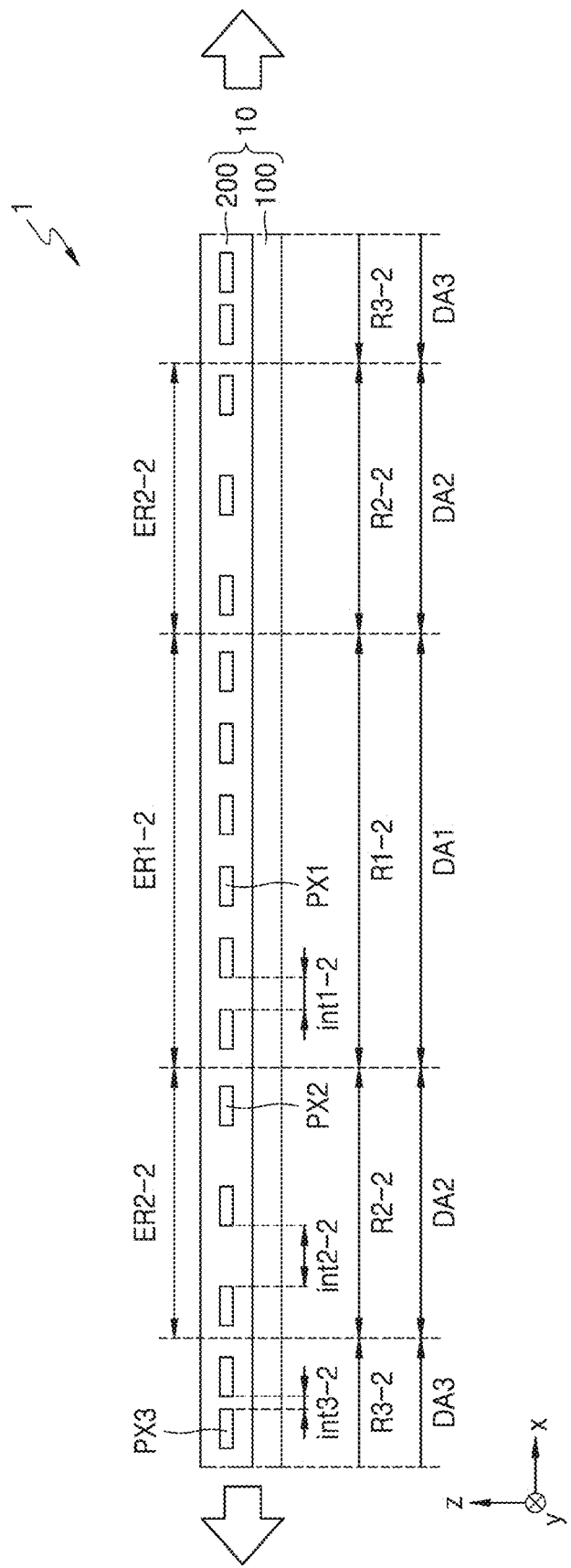

Referring to FIG. 14C, the pixel layer 200 including the plurality of pixels PX may be disposed on the substrate 100. The plurality of first pixels PX1 may be provided with the first interval int1-2 in the first region R1-2. The first interval int1-2 may be set from the first elongation state ER1-2. When tensile force is removed, the display apparatus 1 may be contracted to the surface shape of an object. For the plurality of first pixels PX1 to be arranged in the display apparatus 1 that is contracted, the first interval int1-2 may be increased compared to the constant interval by a rate in which the substrate 100 in the first region R1-2 is elongated. Accordingly, the first pixels PX1 may be arranged with the first interval int1-2 on the substrate 100 extending in one direction. Such description is applicable to not only the first direction (e.g., the x-direction or the (−) x-direction), but also the second direction (e.g., the y-direction or the (−) y-direction) and/or the third direction (e.g. the z-direction or the (−) z-direction).

The plurality of second pixels PX2 may be provided with the second interval int2-2 in the second region R2-2. The second interval int2-2 may be set from the second elongation state ER2-2. When tensile force is removed, the display apparatus 1 may be contracted to the surface shape of an object. For the plurality of second pixels PX2 to be arranged in the display apparatus 1 that is contracted, the second interval int2-2 may be increased compared to the constant interval by a rate in which the substrate 100 in the second region R2-2 is elongated. Accordingly, the second pixels PX2 may be arranged with the second interval int2-2 on the substrate 100 extending in one direction. Such description is applicable to not only the first direction (e.g., the x-direction or the (−) x-direction), but also the second direction (e.g., the y-direction or the (−) y-direction) and/or the third direction (e.g. the z-direction or the (−) z-direction).

In an embodiment, the plurality of third pixels PX3 may be provided with the third interval int3-2 in the third region R3-2. When the substrate 100 in the third region R3-2 is not elongated due to tensile force, the third interval int3-2 may be substantially the same as the constant interval. In another embodiment, when the substrate 100 in the third region R3-2 is elongated due to tensile force, the third interval int3-2 should be greater than the constant interval.

In an embodiment, the structure of the display panel 10 in the first display area DA1 may be different from the structure of the display panel 10 in the second display area DA2 as in the embodiment described with reference to FIGS. 3A to 3C.

In an embodiment, a kind of the material of the display panel 10 in the first display area DA1 may be different from a kind of the material of the display panel 10 in the second display area DA2 as in the embodiment described with reference to FIGS. 6, 7A, and 7B.

In an embodiment, the display apparatus 1 may further include an inorganic layer (not shown) between the substrate 100 and the pixel layer 200. In an embodiment, a film layer may be further arranged on at least one of the upper surface of the display panel 10 and the lower surface of the display panel 10.

Figure 14D:
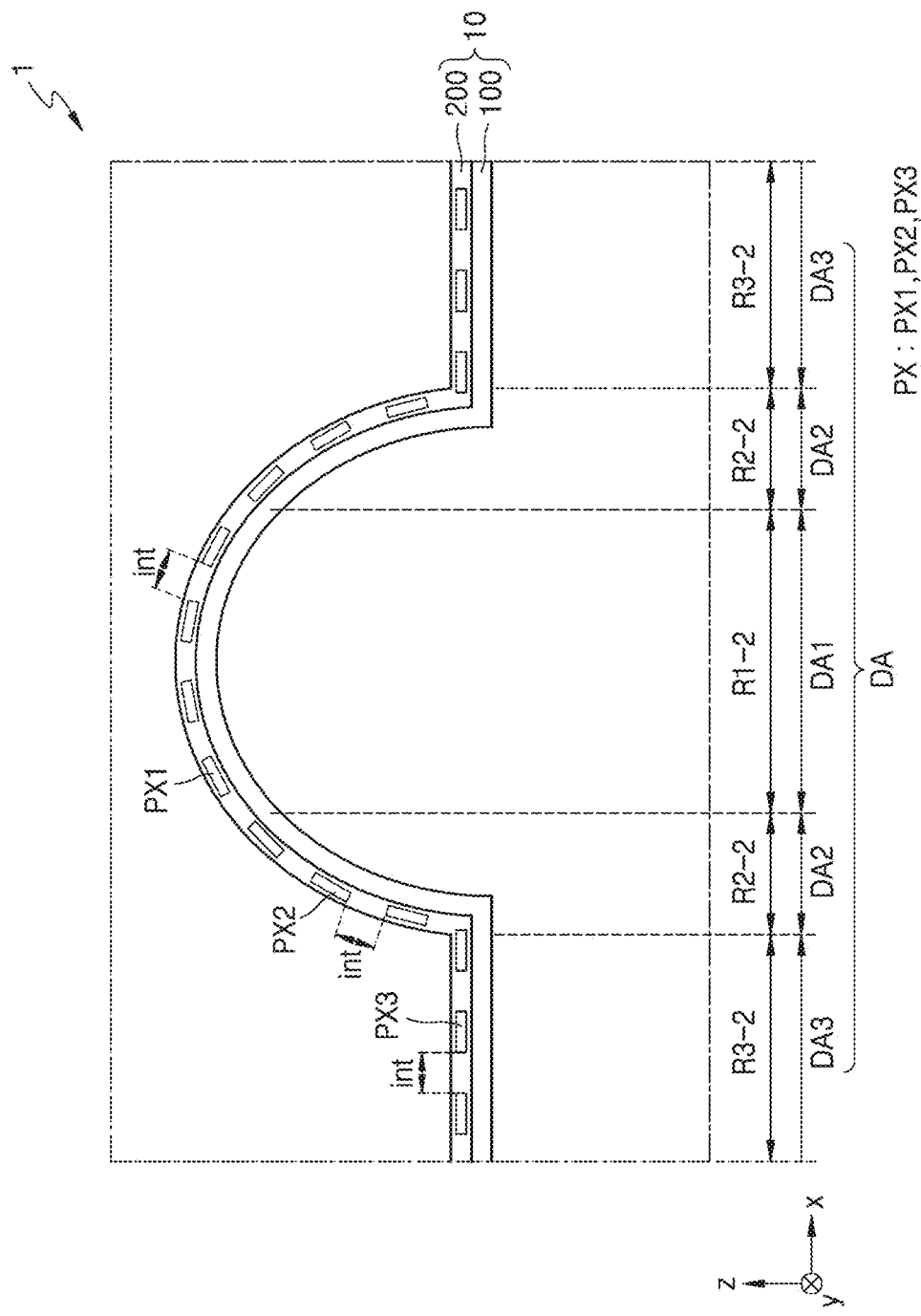

Referring to FIG. 14D, the plurality of pixels PX is provided, and then, tensile force may be removed. In an embodiment, the plurality of first pixels PX1, the plurality of second pixels PX2, and the plurality of third pixels PX3 are provided, and then, the tensile force may be removed.

The display apparatus 1 may be contracted to extend along the surface shape of an object. The first interval and the second interval may be changed to be the same as each other. In an embodiment, the first display area DA1 and/or the first region R1-2 may be contracted by an increase in the first elongation state. Accordingly, the first interval between the first pixels PX1 that are adjacent to each other may be reduced. The second display area DA2 and/or the second region R2-2 may be contracted by an increase in the second elongation state. Accordingly, the second interval between the second pixels PX2 that are adjacent to each other may be reduced. The first interval and the second interval are values set by respectively taking into account the first elongation state and the second elongation state, and may be changed to a constant interval int. Accordingly, the plurality of first pixels PX1, the plurality of second pixels PX2, and the plurality of third pixels PX3 may be arranged with a constant interval int in the display panel 10, and the plurality of pixels PX arranged on the surface of an object may be entirely or substantially prevented from being viewed to a user as being non-uniformly arranged. In addition, because tensile force is removed from the display apparatus 1, the display apparatus 1 may not be in an elongated and/or contracted state.

According to the above description, in an embodiment, the plurality of first pixels and the plurality of second pixels may be uniformly arranged in the first display area and the second display area. Accordingly, the plurality of pixels may be entirely or substantially prevented from being viewed to a user as being non-uniformly arranged.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope of the invention.

What is claimed is:

1. A display apparatus disposed on an object including a first surface having a first shape and a second surface having a second shape different from the first shape, the display apparatus including:
    a display panel arranged on the object and including:
        a first display area extending along the first surface;
        a second display area extending along the second surface;
        a plurality of first pixels arranged with a preset interval in the first display area; and
        a plurality of second pixels arranged with the preset interval in the second display area,
    wherein, when tensile force is applied, a first elongation rate of the display panel in the first display area is different from a second elongation rate of the display panel in the second display area.

2. The display apparatus of claim 1, wherein the first display area includes a plurality of first pixel areas and a plurality of first through areas,
    the plurality of first pixels is respectively arranged in the plurality of first pixel areas,
    the plurality of first through areas in which respective openings are defined through the display panel is arranged outside the plurality of first pixel areas,
    the second display area includes a plurality of second pixel areas and a plurality of second through areas,
    the plurality of second pixels is respectively arranged in the plurality of second pixel areas, and
    the plurality of second through areas in which respective openings are defined through the display panel is arranged outside the plurality of second pixel areas.

3. The display apparatus of claim 2, wherein a first area of one of the plurality of first pixel areas is different from a second area of one of the plurality of second pixel area.

4. The display apparatus of claim 2, wherein the first display area further includes a plurality of first connection areas extending between the plurality of first pixel areas adjacent to each other,
    the second display area further includes a plurality of second connection areas extending between the plurality of second pixel areas adjacent to each other, and
    a shape of one of the plurality of first connection areas is different from a shape of one of the plurality of second connection areas.

5. The display apparatus of claim 4, wherein a first width of one of the plurality of first connection areas is different from a second width of one of the plurality of second connection areas.

6. The display apparatus of claim 4, wherein a first length of one of the plurality of first connection areas is different from a second length of one of the plurality of second connection areas.

7. The display apparatus of claim 4, wherein one of the plurality of first connection areas extends in a linear shape, and one of the plurality of second connection areas extends in a curved shape.

8. The display apparatus of claim 1, wherein the display panel further includes an inorganic layer arranged in the first display area and the second display area, and
    a ratio of the inorganic layer to the display panel in the first display area is different from a ratio of the inorganic layer to the display panel in the second display area.

9. The display apparatus of claim 1, further comprising a film layer arranged on at least one of a first surface of the display panel and a second surface of the display panel opposite to the first surface of the display panel in a thickness direction,
    wherein, when the tensile force is applied, an elongation rate of the film layer in the first display area is different from an elongation rate of the film layer in the second display area.

10. The display apparatus of claim 1, wherein the display panel in the first display area is in one of a relatively high elongation state and a relatively low elongation state, and the display panel in the second display area is in a remaining one of the relatively high elongation state and the relatively low elongation state.

11. A method of manufacturing a display apparatus, the method comprising:
  elongating a display substrate including a first area and a second area such that the display substrate extends along a surface shape of an object;
  determining a first elongation state of the display substrate in the first area and a second elongation state of the display substrate in the second area; and
  forming a display panel including a first display area and a second display area and extending in one direction, a plurality of first pixels being arranged with a first interval set from the first elongation state in the first display area, and a plurality of second pixels being arranged with a second interval set from the second elongation state in the second display area.

12. The method of claim 11, further comprising:
  transforming the display panel to extend along a surface shape of the object; and
  changing the first interval and the second interval to be identical to each other.

13. The method of claim 12, wherein the first elongation state is one of a relatively high elongation state and a relatively low elongation state, and
  the second elongation state is a remaining one of the relatively high elongation state and the relatively low elongation state.

14. The method of claim 12, wherein the display panel includes a first surface of the display panel and a second surface of the display panel opposite to the first surface of the display panel in a thickness direction, and
  the transforming the display panel includes allowing a mold to face one of the first surface of the display panel and the second surface of the display panel.

15. The method of claim 11, wherein, when tensile force is applied, the display panel has a first elongation rate in the first display area and has a second elongation rate in the second display area.

16. The method of claim 11, further comprising attaching a film layer to at least one of a first surface of the display panel and a second surface of the display panel opposite to the first surface of the display panel in a thickness direction,
  wherein, when tensile force is applied, an elongation rate of the film layer in the first display area is different from an elongation rate of the film layer in the second display area.

17. The method of claim 16, further comprising, after the attaching the film layer to the display panel, processing the film layer arranged on at least one of the first display area and the second display area.

18. The method of claim 11, wherein the elongating the display substrate along the surface shape of the object includes transforming the display substrate extending in one direction to extend along a surface shape of a mold.

19. A method of manufacturing a display apparatus, the method comprising:
  preparing a substrate including a first area and a second area each extending along a surface shape of an object;
  applying tensile force to extend the first area and the second area in one direction;
  determining a first elongation state of the substrate in the first area and a second elongation state of the substrate in the second area; and
  forming a plurality of first pixels with a first interval set from the first elongation state in the first area and forming a plurality of second pixels with a second interval set from the second elongation state in the second area.

20. The method of claim 19, further comprising, after the forming the plurality of first pixels and the plurality of second pixels, removing the tensile force.

\* \* \* \* \*